(12) United States Patent
Shimai et al.

(10) Patent No.: US 8,807,072 B2
(45) Date of Patent: Aug. 19, 2014

(54) COATING DEVICE

(75) Inventors: Futoshi Shimai, Kawasaki (JP);
Tsutomu Sahoda, Kawasaki (JP);
Akihiko Sato, Kawasaki (JP); Kenji Maruyama, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 143 days.

(21) Appl. No.: 13/251,468

(22) Filed: Oct. 3, 2011

(65) Prior Publication Data
US 2012/0079983 A1 Apr. 5, 2012

(30) Foreign Application Priority Data

Oct. 4, 2010 (JP) ................. P2010-224978

(51) Int. Cl.
*B05C 5/02* (2006.01)
*B05B 13/02* (2006.01)
*B05C 5/00* (2006.01)
*B05B 13/00* (2006.01)
*H01L 21/67* (2006.01)

(52) U.S. Cl.
CPC .............. *B05C 5/0208* (2013.01); *B05C 5/02* (2013.01); *H01L 21/6715* (2013.01); *H01L 21/67011* (2013.01); *B05B 13/02* (2013.01)
USPC .......................... 118/320; 118/300

(58) Field of Classification Search
None
See application file for complete search history.

(56) References Cited

U.S. PATENT DOCUMENTS

| | | | |
|---|---|---|---|
| 4,073,262 A | 2/1978 | Scheffel et al. | |
| 4,183,797 A | 1/1980 | Kennedy et al. | |
| 4,889,069 A | 12/1989 | Kawakami | |
| 5,782,978 A * | 7/1998 | Kinose et al. | 118/321 |
| 5,803,968 A | 9/1998 | Schwartz et al. | |
| 5,935,331 A * | 8/1999 | Naka et al. | 118/319 |

FOREIGN PATENT DOCUMENTS

| | | | | |
|---|---|---|---|---|
| JP | A-62-006441 | 1/1987 | | |
| JP | A-01-135565 | 5/1989 | | |
| JP | 04-283420 | * 10/1992 | ............... | B05C 5/00 |
| JP | A-04-283420 | 10/1992 | | |
| JP | A-2006-198487 | 8/2006 | | |

* cited by examiner

*Primary Examiner* — Dah-Wei D Yuan
*Assistant Examiner* — Jethro Pence
(74) *Attorney, Agent, or Firm* — Knobbe Martens Olson & Bear LLP

(57) ABSTRACT

Provided is a coating device including: a rotating part which rotatably holds a substrate while the substrate is upright; a cup portion disposed to surround an outer periphery of the substrate held by the rotating part and having an opening which exposes a first surface and a second surface of the substrate; a coating part which includes a nozzle ejecting a liquid material to the first surface and to the second surface of the substrate through the opening; and a cover portion which is provided on the first surface and the second surface sides of the substrate and by which the opening is opened and closed.

10 Claims, 16 Drawing Sheets

COATING DEVICE

FIELD OF THE INVENTION

The present invention relates to a coating device. Priority is claimed on Japanese Patent Application No. 2010-224978, filed Oct. 4, 2010, the content of which is incorporated herein by reference.

DESCRIPTION OF THE RELATED ART

In a substrate processing system that forms a thin coating film such as a resist film on, for example, various substrates such as a semiconductor substrate, a glass substrate constituting a liquid panel, and a substrate constituting a hard disk, a coating device forming a coating film on the substrate while rotating the substrate has been used. Such a coating device generally adopts a configuration in which the substrate is laid down in parallel to the horizontal plane and the substrate rotates while the lower surface thereof is held.

On the other hand, in a substrate constituting a hard disk which needs to coat a liquid material on both surfaces of the substrate, the lower surface of the substrate may not be held. For this reason, as disclosed in JP-A-H04-283420, a configuration has been proposed in which the substrate is rotated while being held by a holding piece.

When the liquid material is applied to both surfaces of the substrate while the substrate is laid down, there is a concern that the application environment between the first and second surfaces of the substrate is different and the thin coating films formed thereon are different. Therefore, recently, there has been proposed a configuration in which the liquid material is applied to both surfaces of the substrate while the substrate is upright.

When the liquid material is applied to both surfaces of the substrate while the substrate is upright, for example, a method may be considered in which a substrate is accommodated in a vertical cup and a liquid material is ejected from a nozzle to the substrate while the substrate rotates.

DOCUMENTS OF RELATED ART

Patent Documents

[Patent Document 1] Japanese Unexamined Patent Application, First Publication No. H4-283420

SUMMARY OF THE INVENTION

In the above-described method, when a liquid material is applied to a substrate in an environment in which the liquid material is readily volatilized, the liquid material is difficult to be spread. Therefore, for example, since a coating film of the liquid material may be formed with striations or with a variety of thicknesses so that the thickness increases at an outer and inner end surface of the substrate, the yield may decrease.

The invention is made in view of such circumstances, and an object thereof is to provide a coating device capable of evenly forming the coating film of the liquid material and preventing a degradation of the yield.

In order to attain the above-described object, according to an aspect of the invention, a coating device is provided including: a rotating part which rotatably holds a substrate while the substrate is upright; a cup portion disposed to surround an outer periphery of the substrate held by the rotating part and having an opening which exposes a first surface and a second surface of the substrate; a coating part which includes a nozzle ejecting a liquid material to the first surface and to the second surface of the substrate through the opening; and a cover portion which is provided on the first surface and the second surface sides of the substrate and by which the opening is opened and closed.

According to the present invention, since the cover portion by which the opening of the cup portion is opened and closed can block the inside of the cup portion for the outside, the air tightness inside the cup portion can be ensured. Accordingly, in the application of the liquid material to the substrate inside the cup portion, since the liquid material is prevented from being volatilized, the coating film of the liquid material can be evenly formed and a degradation of the yield can be prevented.

In the coating device, the cover portion may be provided in the rotating part.

According to the present invention, even when the cover portion is provided in the rotating part, the cover portion by which the opening of the cup portion is opened and closed can block the inside of the cup portion from the outside, and the air tightness inside the cup portion can be ensured. Accordingly, since the liquid material is prevented from being volatilized, a degradation of the yield can be prevented.

In the coating device, the opening may be configured with dimensions through which the substrate is passable.

According to the present invention, even when the opening has dimensions through which the substrate may pass, the cover portion by which the opening of the cup portion is opened and closed can block the inside of the cup portion for the outside and the air tightness inside the cup portion can be ensured. Accordingly, since the liquid material is prevented from being volatilized, a degradation of the yield can be prevented.

In the coating device, the rotating part may include a rotation shaft holding the substrate and inserted into the cup portion, and the cover portion may include a penetration hole penetrated by the rotation shaft.

According to the present invention, since the cover portion includes the penetration hole, the cup portion can be blocked by the cover portion while inserting the rotation shaft into the cup portion.

In the coating device, the cover portion may include a groove portion formed around the inner surface of the penetration hole, and the rotation shaft may include a diameter increasing portion inserted into the groove portion.

According to the present invention, since the cover portion includes a groove portion formed around the inner surface of the penetration hole and the rotation shaft may include a diameter increasing portion inserted into the groove portion, the groove portion of the cover portion and the diameter increasing portion of the rotation shaft can be engaged. Accordingly, since a space between the cover portion and the rotation shaft can be less, the air tightness inside the cup portion can be enhanced.

In the coating device, the cover portion may include a nozzle insertion hole.

According to the present invention, since the cover portion includes the nozzle insertion hole, the nozzle can be inserted into the cup portion while the cup portion is blocked by the cover portion. Accordingly, while the air tightness of the cup portion is enhanced, the liquid material can be reliably applied to the substrate.

In the coating device, the coating device may further include a driving part moving the cover portion.

According to the present invention, since the coating device further includes a driving part moving the cover portion, the cover portion can be opened or closed depending on a processing status of the substrate. Accordingly, the processing efficiency can be enhanced.

In the coating device, the cover portion may be configured to be dividable.

According to the present invention, since the cover portion is configured to be dividable, for example, in opening the opening, the cover portion is separated and in closing the opening, the cover portion is combined. In this manner, opening and closing operation of the opening can be efficiently performed.

In the coating device, the coating device may further include a guide portion moving each part into which the cover portion is divided at a position in which the opening is interposed therebetween.

According to the present invention, since the coating device may further include a guide portion moving each part into which the cover portion is divided at a position in which the opening is interposed therebetween, in the separation and combination of the cover portion, the cover portion is not deviated and it is possible to precisely control the position.

In the coating device, the cover portion may be provided in the cup portion.

According to the present invention, since the cover portion is provided in the cup portion, a holding mechanism and the like holding the cover portion is not separately provided and the number of components can be reduced.

According to the present invention, the coating film of the liquid material can be evenly formed and a degradation of the yield can be prevented.

DETAILED DESCRIPTION OF THE INVENTION

Figure 1:
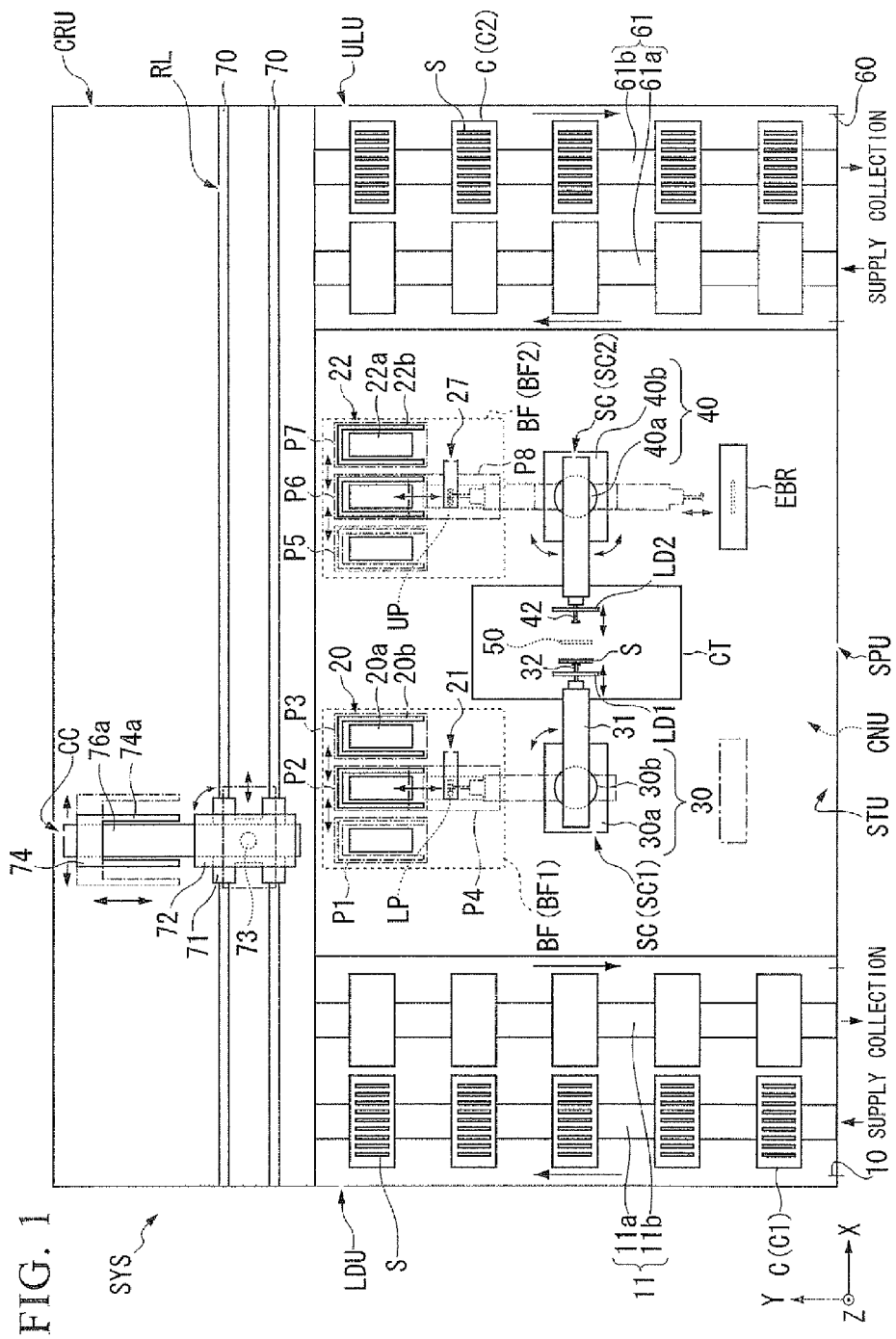
FIG. 1 is a plan view illustrating a configuration of a substrate processing system according to an embodiment of the invention.

An embodiment of the invention will be described by referring to the drawings.

Figure 2:
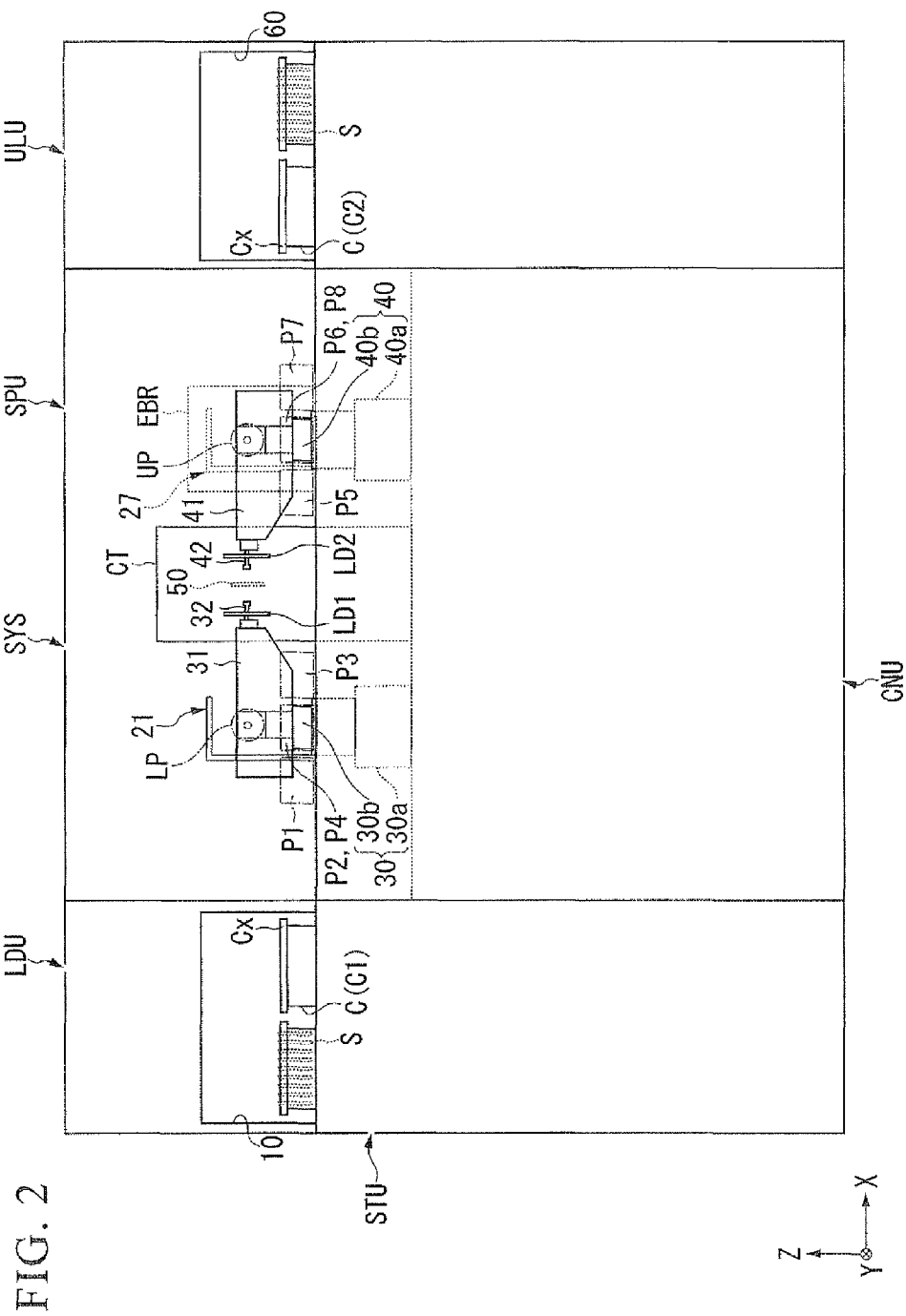
FIG. 2 is a front view illustrating the configuration of the substrate processing system according to the embodiment.
Figure 3:
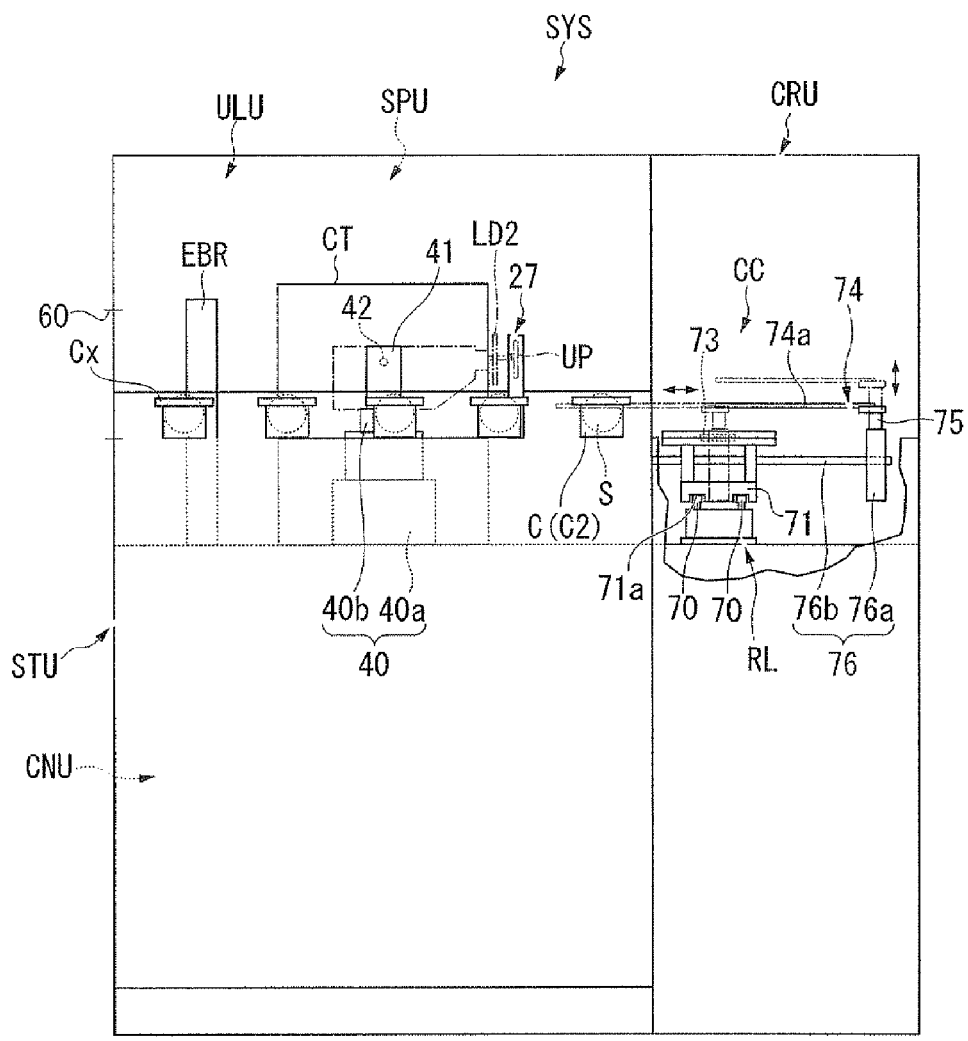
FIG. 3 is a side view illustrating the configuration of the substrate processing system according to the embodiment.

FIG. 1 is a plan view illustrating a schematic configuration of a substrate processing system SYS according to the embodiment. FIG. 2 is a front view illustrating a schematic configuration of the substrate processing system SYS. FIG. 3 is a side view illustrating the schematic configuration of the substrate processing system SYS.

In the embodiment, the directions of the drawings are simply marked by using the XYZ coordinate system for the description of the configuration of the substrate processing system SYS. In the XYZ coordinate system, the left/right direction of the drawings is marked as the X direction and the direction perpendicular to the X direction as seen from the plan view is marked as the Y direction. The direction perpendicular to the plane including the axes of the X direction and the Y direction is marked as the Z direction. In each of the X direction, the Y direction, and the Z direction, the direction indicated by the arrow is described as the +direction and the direction opposite to the direction indicated by the arrow is described as the −direction.

As shown in FIGS. 1 to 3, the substrate processing system SYS is, for example, a system that is used by being included in a production line of a factory or the like to form a thin coating film on a predetermined area of the substrate S. The substrate processing system SYS includes a stage unit STU, a substrate processing unit (coating device) SPU, a substrate loading unit LDU, a substrate unloading unit ULU, a carrying unit CRU, and a control unit CNU.

In the substrate processing system SYS, the stage unit STU is supported on a surface of a floor through, for example, a leg portion, and the substrate processing unit SPU, the substrate loading unit LDU, the substrate unloading unit ULU, and the carrying unit CRU are disposed on the upper surface of the stage unit STU. The interior of each of the substrate processing unit SPU, the substrate loading unit LDU, the substrate unloading unit ULU, and the carrying unit CRU is covered by a cover member. In the substrate processing system SYS, the substrate processing unit SPU, the substrate loading unit LDU, and the substrate unloading unit ULU are arranged in a straight line along the X direction. The substrate processing unit SPU is provided between the substrate loading unit LDU and the substrate unloading unit ULU.

As seen from the plan view, the center of the portion where the substrate processing unit SPU is disposed on the stage unit STU is recessed in the −Z direction compared to the other units.

As a substrate S to be processed in the substrate processing system SYS of the embodiment, for example, a semiconductor substrate such as silicone, a glass substrate constituting a liquid crystal panel, a substrate constituting a hard disk, and the like may be mentioned. In the embodiment, for example, a substrate S will be described, where the substrate S forms a hard disk, having a diamond coating on a surface of a disc-shaped base formed of glass, and having an opening formed at the center thereof as seen form the plan view.

In the substrate processing system SYS of the embodiment, the substrate S is loaded or unloaded by a cassette C capable of accommodating 2 or more substrates S. The cassette C is a square container, and is capable of accommodating the 2 or more substrates S in a straight line so that the substrate surfaces of the substrates S face each other. Accordingly, the cassette C is configured to accommodate the substrate S while the substrate S stands upright in the Z direction. The cassette C has an opening formed at the bottom portion thereof. Each substrate S is accommodated while being exposed to the bottom portion of the cassette C through the opening. The cassette C is formed in a rectangular shape as seen from the plan view, and for example, as shown in FIG. 2, the cassette C has an engagement portion Cx formed at each +Z side thereof. In the embodiment, as the cassette C, two types of cassettes are used, where one type is a loading cassette C1 which is used to load the substrate S and an unloading cassette C2 which is used to unload the substrate S. The loading cassette C1 accommodates only the unprocessed substrate S, and the unloading cassette C2 accommodates only the processed substrate S. The loading cassette C1 is used between the substrate processing unit SPU and the substrate loading unit LDU. The unloading cassette C2 is used between the substrate processing unit SPU and the substrate unloading unit ULU. Accordingly, the loading cassette C1 and the unloading cassette C2 are not used together for the same purpose.

The loading cassette C1 and the unloading cassette C2 are formed to have, for example, the same shape and the same dimensions.

(Substrate Loading Unit)

The substrate loading unit LDU is disposed at the −X side in the substrate processing system SYS.

The substrate loading unit LDU is a unit to which the loading cassette C1 accommodating the unprocessed substrate S is supplied and in which the empty loading cassette C1 is collected. The substrate loading unit LDU is formed to be elongated in the Y direction, and 2 or more loading cassettes C1 are disposed along the Y direction in a standby state.

The substrate loading unit LDU includes a cassette entrance 10 and a cassette moving mechanism (a second moving mechanism) 11. The cassette entrance 10 is an opening which is provided at the −Y side of a cover member covering the substrate loading unit LDU. The cassette entrance 10 is an entrance (a supply opening) of the loading cassette C1 accommodating the unprocessed substrate S and an exit (a collection opening) of the empty loading cassette C1.

The cassette moving mechanism 11 includes, for example, a driving mechanism such as a belt conveyor mechanism. In the embodiment, as the driving mechanism, a conveyor belt (a supply belt 11a and a collecting belt 11b) is provided. The conveyor belt extends from the +Y-side end portion of the substrate loading unit LDU to the −Y-side end portion thereof in the Y direction, and two conveyor belts are disposed in parallel in the X direction.

The supply belt 11a is a conveyor belt which is one of the two conveyor belts and which is disposed at the −X side. The +Z side of the supply belt 11a is used as a carrying surface. The supply belt 11a is configured to rotate so that the carrying surface moves in the +Y direction. Two or more loading cassettes C1 entering the substrate loading unit LDU through the cassette entrance 10 are placed on the carrying surface of the supply belt 11a. The loading cassette C1 is configured to move toward the carrying unit CRU through the rotation of the supply belt 11a.

The collecting belt 11b is a conveyor belt which is disposed at the +X side among the two conveyor belts. The +Z side of the collecting belt 11b is used as a carrying surface. The collecting belt 11b is configured to rotate so that the carrying surface moves in the −Y direction. Two or more empty loading cassettes C1 are placed on the carrying surface of the collecting belt 11b. The loading cassette C1 is configured to move toward the cassette entrance 10 through the rotation of the collecting belt 11b.

In the embodiment, for example, the loading cassettes C1 may be disposed in a standby state at five standby positions (container standby positions) on each of the supply belt 11a and the collecting belt 11b. In the substrate loading unit LDU, the standby position for the loading cassette C1 may be moved by rotating the supply belt 11a and the collecting belt 11b, and the carrying time of the loading cassette C1 may be shortened by moving the standby position.

(Substrate Processing Unit)

The substrate processing unit SPU is disposed substantially at the center of the X direction in the substrate processing system SYS. The substrate processing unit SPU is a unit which is used to perform various processes on the substrate S, and the process includes a process forming a thin coating film on the substrate S by coating a liquid material such as a resist thereon, a process removing a thin coating film formed on the peripheral portion of the substrate S, or the like. The substrate processing unit SPU includes buffer mechanisms BF, a substrate carrying mechanism (a rotating part) SC, an application mechanism (a coating part) CT, and a peripheral edge portion removal mechanism EBR.

The buffer mechanisms BF are respectively provided at two positions with the application mechanism CT interposed therebetween in the X direction along the +Y side of the substrate processing unit SPU. In the buffer mechanisms BF disposed at two positions, the buffer mechanism disposed at the −X side of the application mechanism CT is a loading-side buffer mechanism (a substrate loading area) BF1, and the buffer mechanism disposed at the +X side of the application mechanism CT is an unloading-side buffer mechanism (a substrate unloading area) BF2.

The loading-side buffer mechanism BF1 is a portion which allows the loading cassette C1 to be in a standby state. The loading-side buffer mechanism BF1 has 2 or more standby positions for the loading cassette C1. For example, the loading-side buffer mechanism BF1 may have four standby positions for the loading cassette C1 (the standby positions P1 to P4). The three standby positions P1 to P3 among these are arranged in the X direction. The standby position P1 disposed at the −X side of the drawing is, for example, the standby position for the loading cassette C1 supplied to the substrate processing unit SPU. The standby position P2 at the center of the X direction of the drawing is the standby position for the loading cassette C1 moved from the standby position P1. The standby position P3 at the +X side of the drawing is the standby position for the loading cassette C1 moved from the standby position P2. Further, the standby position P4 is disposed at the −Y side with respect to the standby position P2. A loading position LP of the substrate S is provided above the standby position P4 in the +Z direction. The substrate S is carried to the application mechanism CT through the loading position LP.

The unloading-side buffer mechanism BF2 is a portion which allows the unloading cassette C2 to be in a standby state. The unloading-side buffer mechanism BF2 has 2 or more standby positions for the unloading cassette C2. For example, the unloading-side buffer mechanism BF2 may have four standby positions for the unloading cassette C2 (the standby positions P5 to P8). The three standby positions P5 to P7 are arranged in the X direction. The standby position P5 at the −X side of the drawing is, for example, the standby position for the unloading cassette C2 supplied to the substrate processing unit SPU. The standby position P6 at the center in the X direction is the standby position for the unloading cassette C2 moved from the standby position P5. The standby position P7 at the +X side of the drawing is the standby position for the unloading cassette C2 moved from the standby position P6. Further, the standby position P8 is disposed at the −Y side with respect to the standby position P6. An unloading position UP of the substrate S is provided above the standby position P8 in the +Z direction. The substrate S is carried from the application mechanism CT through the unloading position UP.

Figure 4:
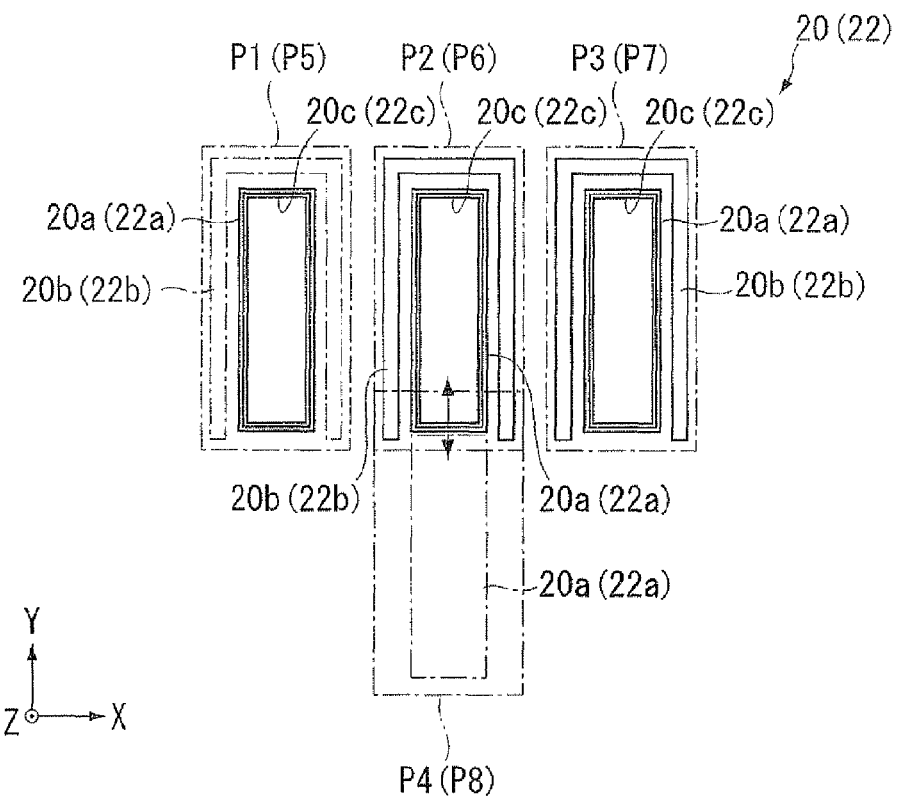
FIG. 4 is a diagram illustrating a configuration of a buffer mechanism.
Figure 5:
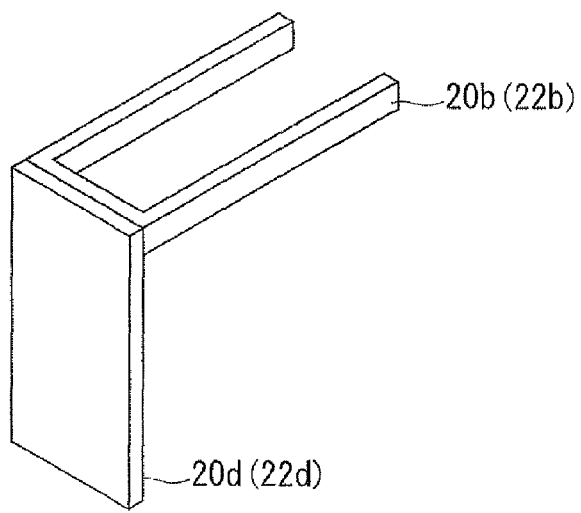
FIG. 5 is a diagram illustrating a configuration of the buffer mechanism.
Figure 6:
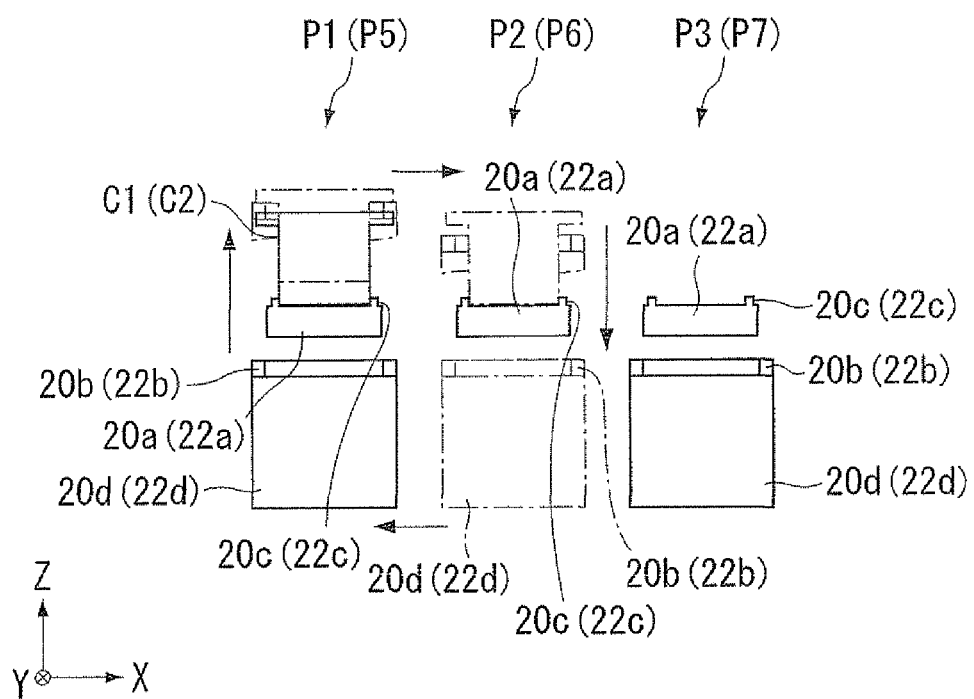
FIG. 6 is a diagram illustrating a configuration of the buffer mechanism.

FIG. 4 is an enlarged diagram illustrating cassette moving mechanisms 20 and 22 of FIG. 1. FIG. 5 is a diagram illustrating a configuration of part of the cassette moving mechanisms 20 and 22. FIG. 6 is a diagram illustrating the cassette moving mechanisms 20 and 22 when seen from the +Y direction. Since the cassette moving mechanism 20 and the cassette moving mechanism 22 have the same configuration, the cassette moving mechanism 20 will be described. In FIGS. 4 to 6, the components (including the unloading cassette C2 and the standby positions P5 to P8) of the cassette moving mechanism 22 corresponding to the components (including the loading cassette C1 and the standby positions P1 to P4) of the cassette moving mechanism 20 are denoted by symbols placed in brackets.

As shown in FIGS. 1 and 4 to 6, the loading-side buffer mechanism BF1 includes the cassette moving mechanism (the third moving mechanism) 20. The cassette moving mechanism 20 includes a cassette placing member 20a and a cassette carrying arm 20b. The cassette placing member 20a is a plate-like member which is provided at each of the standby positions P1 to P3. The loading cassette C1 is placed on the +Z-side surface of the cassette placing member 20a.

As shown in FIGS. 1 and 4, the cassette placing member 20a provided at the standby position P2 is configured to move in the Y direction by a driving unit (not shown). For this reason, the cassette placing member 20a provided at the standby position P2 is configured to move between the standby position P2 and the standby position P4 by way of the driving unit. The cassette placing members 20a provided at the standby positions P1 and P3 are fixed.

As shown in FIGS. 4 and 6, an annular convex portion 20c is formed in the +Z-side surface (the placing surface) of the cassette placing member 20a along the outer periphery of the loading cassette C1. Since the convex portion 20c is provided, the loading cassette C1 is fitted into the convex portion 20c while the loading cassette C1 is placed on the cassette placing member 20a. For this reason, the loading cassette C1 may be positioned and the positional deviation of the loading cassette C1 may be prevented.

The cassette carrying arms 20b are provided at two of the standby positions P1 to P3. Each cassette carrying arm 20b is formed along the outer periphery of the cassette placing member 20a when seen in the Z direction. The cassette carrying arm 20b is configured to be movable in the X direction and the Z direction by a driving unit (not shown).

As shown in FIG. 5, the cassette carrying arm 20b is supported while being fixed to an arm support member 20d. A driving mechanism (not shown) is connected to the arm support member 20d. The driving mechanism (not shown) is configured to move the arm support member 20d in the X direction and the Z direction. The cassette carrying arm 20b is configured to be movable together with the movement of the arm support member 20d. As shown in FIG. 6, the cassette carrying arm 20b is configured to be movable along the Z direction with respect to the cassette placing member 20a.

Since the positional relationship and the function of the components of the cassette moving mechanism 22 are the same as those of the cassette moving mechanism 20, the description thereof will be omitted. Hereinafter, when mentioning the components of the cassette moving mechanism 22, the same names as those of the components of the cassette moving mechanism 20 will be used and the symbols placed in brackets of FIGS. 4 to 6 will be added to the end of the name.

As shown in FIGS. 1 to 3, the substrate processing unit SPU includes a substrate loading mechanism 21 and a substrate unloading mechanism 27 near the buffer mechanism BF. The substrate loading mechanism 21 is disposed near the standby position P4. On the other hand, the substrate unloading mechanism 27 is disposed near the standby position P8. The configuration of the substrate loading mechanism 21 and the substrate unloading mechanism 27 will be described. Since the substrate loading mechanism 21 and the substrate unloading mechanism 27 have the same configuration, hereinafter, the substrate loading mechanism 21 will be described.

Figure 7:
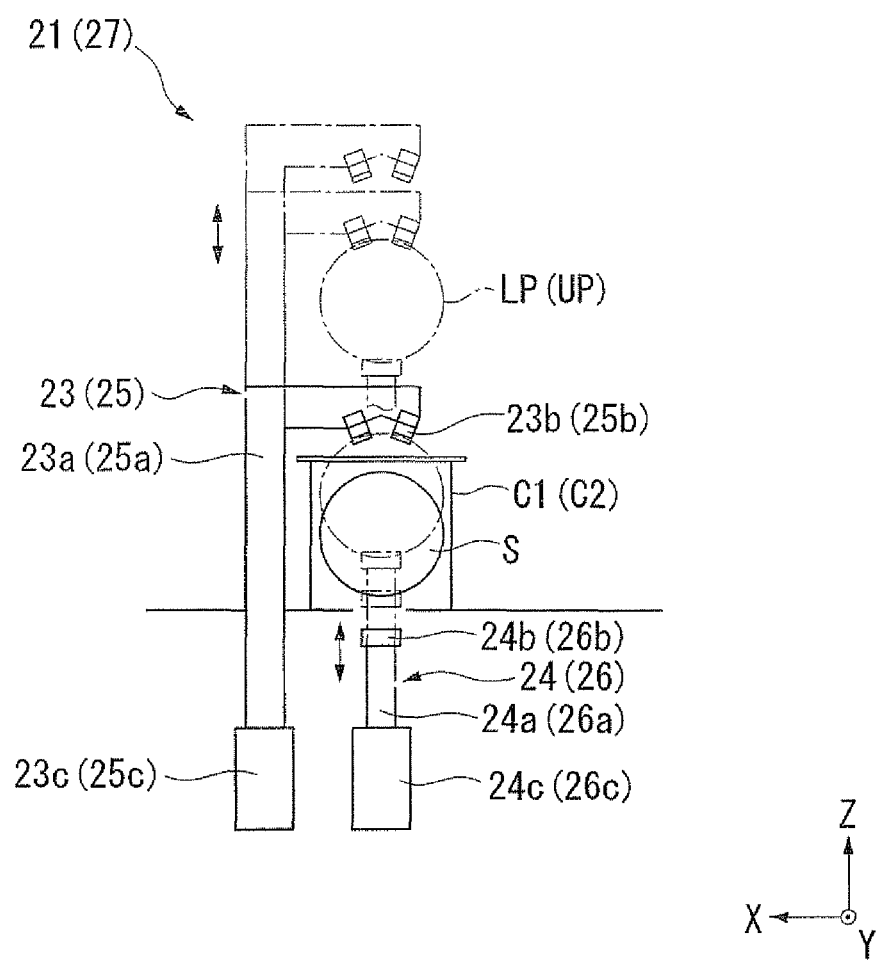
FIG. 7 is a diagram illustrating a configuration of a substrate loading mechanism and a substrate unloading mechanism.
Figure 8:
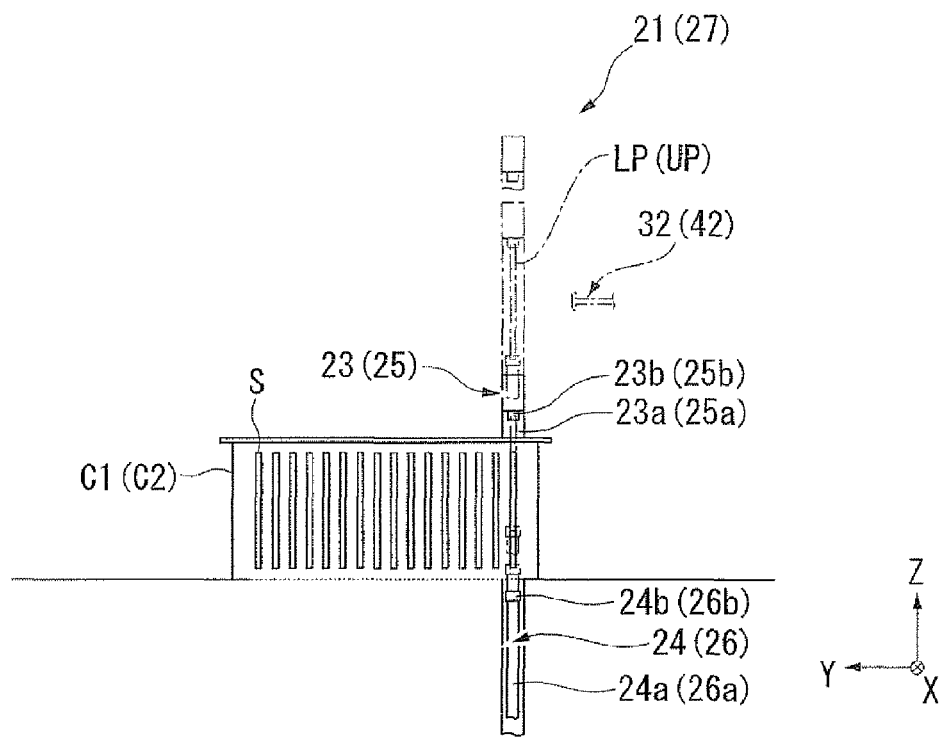
FIG. 8 is a diagram illustrating a configuration of the substrate loading mechanism and the substrate unloading mechanism.
Figure 9:
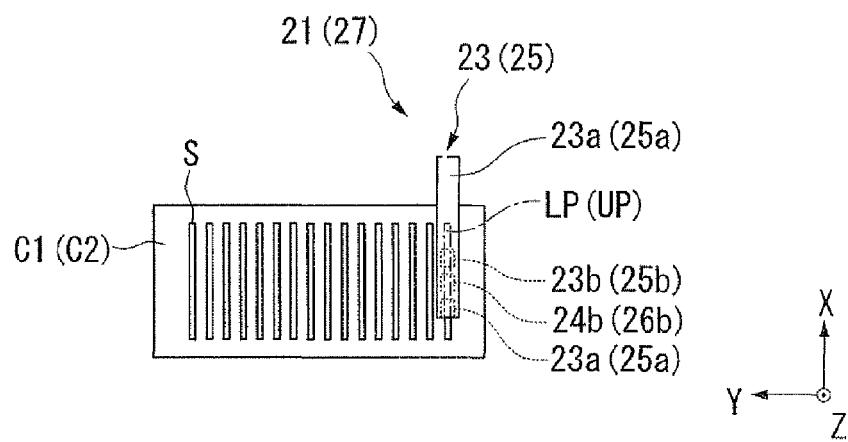
FIG. 9 is a diagram illustrating a configuration of the substrate loading mechanism and the substrate unloading mechanism.

FIGS. 7 to 9 are diagrams schematically illustrating the configuration of the substrate loading mechanism 21 and the substrate unloading mechanism 27. In FIGS. 7 to 9, the components (including the unloading position UP) of the substrate unloading mechanism 27 corresponding to the components (including the loading position LP) of the substrate loading mechanism 21 are denoted by symbols put in brackets.

As shown in FIGS. 7 to 9, the substrate loading mechanism 21 includes an upper substrate portion holding mechanism 23 and a lower substrate portion holding mechanism 24. The upper substrate portion holding mechanism 23 is disposed at the +X side of the standby position P4. The upper substrate portion holding mechanism 23 moves in the Z direction while holding the +Z side of the substrate S. The upper substrate portion holding mechanism 23 includes an elevation member 23a, a clamping member 23b, and an elevation mechanism 23c.

The elevation member 23a is a columnar support member which is formed in an L shape as seen from the side view, and is configured to be movable in the Z direction. The elevation member 23a includes a columnar support portion which extends in the Z direction and a protrusion portion protruding from the upper end of the columnar support portion in the X direction. The columnar support portion is provided from the +Z end surface of the loading cassette C1 up to the +Z side. The protrusion portion in the elevation member 23a is disposed at a position overlapping with the loading position LP as seen from the plan view. The −Z side of the protrusion portion is provided with a concave portion matching the shape of the substrate S.

The clamping member 23b is attached to the concave portion of the elevation member 23a. Accordingly, the clamping member 23b is also provided at a position overlapping with the loading position LP as seen from the plan view. The elevation mechanism 23c is a driving unit attached to the elevation member 23a, and is disposed at the −Z side of the loading cassette C1. As the elevation mechanism 23c, for example, a driving mechanism such as an air cylinder may be used.

The lower substrate portion holding mechanism 24 is provided at a position overlapping with the center of the loading position LP as seen from the plan view. The lower substrate portion holding mechanism 24 moves in the Z direction while holding the −Z side of the substrate S. The lower substrate portion holding mechanism 24 includes an elevation member 24a, a clamping member 24b, and an elevation mechanism 24c. The elevation member 24a is a rod-shaped columnar support member, and is configured to be movable in the Z direction. The clamping member 24b is attached to the +Z-side front end of the elevation member 24a, and the clamping member 24b is also provided at a position overlapping with the center of the loading position LP as seen from the plan view. The elevation mechanism 24c is a driving unit attached to the elevation member 24a, and is disposed at the −Z side of the loading cassette C1. As the elevation mechanism 24c, for example, a driving mechanism such as an air cylinder may be used.

The elevation mechanism 23c of the upper substrate portion holding mechanism 23 and the elevation mechanism 24c of the lower substrate portion holding mechanism 24 may be independently operated and may be operated in a synchronized manner.

Since the positional relationship and the function of the components of the substrate unloading mechanism 27 are the same as those of the corresponding components of the substrate loading mechanism 21, the description thereof will be omitted. Hereinafter, when mentioning the components of the substrate unloading mechanism 27, the same names as those of the corresponding components of the substrate loading mechanism 21 will be used and the symbols placed in brackets of FIGS. 7 to 9 will be added to the end of the name.

As shown in FIGS. 1 to 3, the substrate carrying mechanism SC is provided at two positions with the application mechanism CT interposed therebetween in the X direction to be located at the center of the Y direction of the substrate processing unit SPU. In the substrate carrying mechanisms SC provided at two positions, the mechanism disposed at the −X side of the application mechanism CT is a loading-side carrying mechanism SC1, and the mechanism disposed at the +X side of the application mechanism CT is an unloading-side carrying mechanism SC2. The loading-side carrying mechanism SC1, the unloading-side carrying mechanism SC2, and the application mechanism CT are disposed in a straight line along the X direction.

The loading-side carrying mechanism SC1 may access the application mechanism CT and the loading position LP of the loading-side buffer mechanism BF1 and carry the substrate S therebetween. The unloading-side carrying mechanism SC2 may access the application mechanism CT, the unloading position UP of the unloading-side buffer mechanism BF2, and the peripheral edge portion removal mechanism EBR and carry the substrate S therebetween.

Figure 10A:
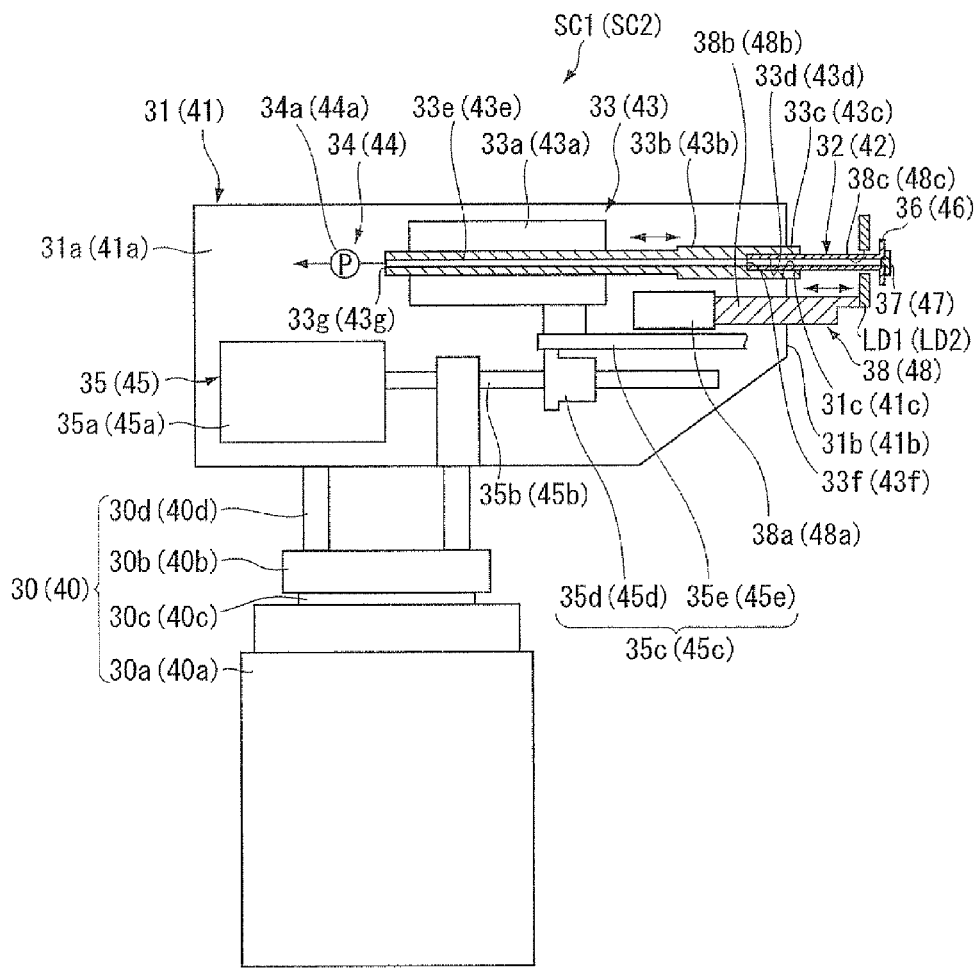
FIG. 10A is a diagram illustrating a configuration of a holding portion.

FIG. 10A is a schematic diagram illustrating the configuration of the loading-side carrying mechanisms SC1 and SC2. Since the loading-side carrying mechanism SC1 and the unloading-side carrying mechanism SC2 have the same configuration, hereinafter, the loading-side carrying mechanism SC1 will be described. In FIG. 10A, the components (including the unloading position UP) of the loading-side carrying mechanism SC2 corresponding to the components (including the loading position LP) of the loading-side carrying mechanism SC1 are denoted by symbols in brackets.

As shown in FIG. 10A, the loading-side carrying mechanism SC1 includes a base portion 30, an arm portion 31, and a holding portion 32. The base portion 30 is provided on an upper surface of a recessed portion of the stage unit STU. The base portion 30 includes a fixed table 30a, a rotation table 30b, a rotation mechanism 30c, and a support member 30d.

The fixed table 30a is fixed to the upper surface of the recessed portion of the stage unit STU. The base portion 30 is fixed onto the stage unit STU with the fixed table 30a interposed therebetween so that positional deviation thereof does not occur. The rotation table 30b is disposed on the fixed table 30a with the rotation mechanism 30c interposed therebetween. The rotation table 30b is provided to be rotatable with respect to the fixed table 30a about the Z axis serving as a rotation axis. The rotation mechanism 30c is provided between the fixed table 30a and the rotation table 30b, and is a driving mechanism that applies a rotation force to the rotation table 30b. The support member 30d is a columnar support member of which the −Z-side end portion is fixed onto the rotation table 30b. The support member 30d is provided at 2 or more positions, for example, two positions of the rotation table 30b. The +Z-side end portion of the support member 30d is inserted into the arm portion 31.

The arm portion 31 is supported by the support member 30d of the base portion 30. The arm portion 31 moves the holding portion 32 to different positions within the substrate processing unit SPU. The arm portion 31 includes a pentagonal columnar casing 31a. A front end surface 31b of the casing 31a is provided with an opening 31c. The casing 31a has therein a rotation mechanism 33, a suction mechanism 34, a moving mechanism 35, a cover portion LD1, and a cover portion driving mechanism 38.

The rotation mechanism 33 is disposed at the +Z side inside the casing 31a. The rotation mechanism 33 includes a motor device 33a and a rotation shaft member 33b. The motor device 33a and the rotation shaft member 33b are configured to be movable together in the left/right direction of the drawing. The motor device 33a is a driving device which applies a rotation force to the rotation shaft member 33b. The rotation shaft member 33b is a bar-like member which is disposed to be parallel to the XY plane and has a circular cross-section.

The rotation shaft member 33b is configured to rotate about the rotation axis by the driving force of the motor device 33a. The rotation shaft member 33b is disposed so that one end thereof protrudes from the opening 31c to the outside of the casing 31a (a protrusion portion 33c). The end surface at the side of the protrusion portion 33c of the rotation shaft member 33b is provided with a concave portion 33d which is used for the attachment of the holding portion 32. The concave portion 33d has a circular cross-section. The protrusion portion 33c includes a fixation mechanism which fixes the holding portion 32 while the holding portion 32 is attached to the concave portion 33d. When the holding portion 32 is fixed by the fixation mechanism, the rotation shaft member 33b and the holding portion 32 may rotate together.

The rotation shaft member 33b includes a penetration hole 33e. The penetration hole 33e is formed to penetrate a bottom surface 33f of the concave portion 33d of the rotation shaft member 33b and the other end surface 33g of the rotation shaft member 33b along the direction of the rotation shaft. The bottom surface 33f of the concave portion 33d of the rotation shaft member 33b may communicate with the end surface 33g thereof through the penetration hole 33e.

The suction mechanism 34 is provided on the side of the end surface 33g of the rotation shaft member 33b. The suction mechanism 34 includes a suction device such as a suction pump 34a. The suction pump 34a is connected to the penetration hole 33e at the end surface 33g of the rotation shaft member 33b. When the suction pump 34a suctions the penetration hole 33e from the end surface 33g of the rotation shaft member 33b, the suction pump 34a may suction the bottom surface 33f of the concave portion 33d communicating with the penetration hole 33e.

The moving mechanism 35 is disposed at the −Z side inside the casing 31a. The moving mechanism 35 includes a motor device 35a, a rotation shaft member 35b, and a movable member 35c. The motor device 35a is a driving device which applies a rotation force to the rotation shaft member 35b. The rotation shaft member 35b is a bar-like member of which one end is inserted into the motor device 35a and which has a circular cross-section. The rotation shaft member 35b is configured to rotate about the rotation axis by the driving force of the motor device 35a. The surface of the rotation shaft member 35b is provided with a thread (not shown).

The movable member 35c includes a threading portion 35d and a connection member 35e. The threading portion 35d is integrally formed with the rotation shaft member 35b and has a screw hole (not shown) formed on the surface thereof.

The connection member 35e is fixed to, for example, the motor device 33a of the rotation mechanism 33. The lower surface of the connection member 35e is provided with a thread, and the thread may mesh with the thread formed on the threading portion 35d.

When the rotation shaft member 35b rotates by the driving of the motor device 35a, the rotation shaft member 35b and the threading portion 35d rotate together. Through the rotation of the threading portion 35d, the connection member 35e meshing with the thread of the threading portion 35d moves in the left/right direction of the drawing, and the connection member 35e and the rotation mechanism 33 fixed to the connection member 35e move together in the left/right direction of the drawing. By this movement, the holding portion 32 provided at the right end of the rotation mechanism 33 in the drawing moves in the left/right direction of the drawing.

The holding portion 32 is detachably fixed to the concave portion 33d of the arm portion 31. The holding portion 32 holds the substrate S by using, for example, a holding force such as a suction force. The holding portion 32 includes a suction member 36 and a blocking member 37. The suction member 36 and the blocking member 37 are detachably provided.

Figure 10B:
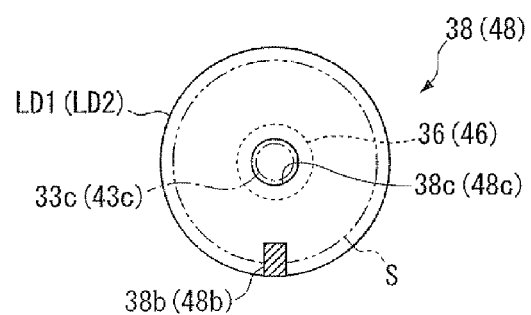
FIG. 10B is a diagram illustrating a configuration of a holding portion.

FIG. 10B is a diagram illustrating the configuration of the cover portion LD1 when seen from the direction in which the rotation shaft member 33b is extended. As shown in FIG. 10B, the cover portion LD1 is formed so that the cover portion LD1 have larger dimensions than those of the substrate S, and the cover portion LD1 is formed, for example, in a circular shape. The cover portion LD1 is, for example, a portion facing the first surface of the substrate S when the liquid material is applied to the substrate S.

As shown in FIG. 10A and FIG. 10B, the cover portion LD1 has a circular opening 38c at the center. Part of the holding portion 32 is inserted into the opening 38c. While part of the holding portion 32 is inserted into the opening 38c, a space is formed between the cover portion LD1 and the holding portion 32. The cover portion LD1 is disposed so as to form the space between the cover portion LD1 and the holding portion 32 and so as not to contact the holding portion 32 so that the holding portion 32 is rotatable without contacting the cover portion LD1.

The cover portion driving mechanism 38 has a stator 38a and mover 38b. As the cover portion driving mechanism 38, for example, an air cylinder mechanism, a motor mechanism or the like may be used. In addition, as the cover portion driving mechanism 38, 2 or more of these mechanisms may be appropriately used in combination.

The stator 38a, for example, is disposed inside the arm portion 31. The stator 38a drives the mover 38b. The mover 38b is formed by using, for example, a material having rigidity such as aluminum (for example, a metal material and the like). The mover 38b may be formed in an elongated shape.

The mover 38b is disposed so that the longitudinal direction of the mover 38b is parallel with the extended direction of the rotation shaft member 33b. The stator 38a moves the mover 38b in the longitudinal direction of the mover 38b. One end of the mover 38b is connected to the stator 38a. The other end of the mover 38b is fixed to the lower of the cover portion LD1 as shown in the figure. Of course, the other end of the mover 38b may be fixed to the other portion of the cover portion LD1.

The mover 38b is provided to be movable in the parallel direction with the extended direction of the rotation shaft member 33b for the stator 38a. Hence, by moving the mover 38b, the cover portion LD1 is moved along the extended direction of the rotation shaft member 33b. The cover portion driving mechanism 38 (the stator 38a and the mover 38b) is a driving system which is independent of a motor device 35a. and the like. In this manner, the cover portion LD1 is independently driven from driving the holding portion 32.

In the loading-side carrying mechanism SC1 with the above-described configuration, when the arm portion 31 rotates about the Z axis serving as the rotation axis or moves in the direction of the XY plane, the holding portion 32 may access both the application mechanism CT and the loading position LP. Further, the loading-side carrying mechanism SC1 may hold the substrate S upright in the Z direction by the suction force of the suction pump 34a inside the arm portion 31 and may rotate the substrate S while being upright in the Z direction by rotating the rotation shaft member 33b inside the arm portion 31. Furthermore, the state where the substrate S is upright in the Z direction indicates the state where the substrate S is inclined with respect to the horizontal plane. In the embodiment, it is desirable to rotate the substrate S held upright while being inclined with respect to the horizontal plane at, for example, 70° to 90°. It is preferably at 75° to 90°, and more preferably at 80° to 90°. The rotation shaft members disposed in the arm portion 31 and the like rotating the substrate may have a configuration in which 2 or more shaft members are connected to each other through a coupling.

Since the positional relationship and the function of the components of the unloading-side carrying mechanism SC2 are the same as those of the corresponding component of the loading-side carrying mechanism SC1, the description thereof will be omitted. Hereinafter, when mentioning the components of the unloading-side carrying mechanism SC2, the same names as those of the components of the loading-side carrying mechanism SC1 will be used and the symbols placed in brackets of FIG. 10A will be added to the end of the name.

Figure 11:
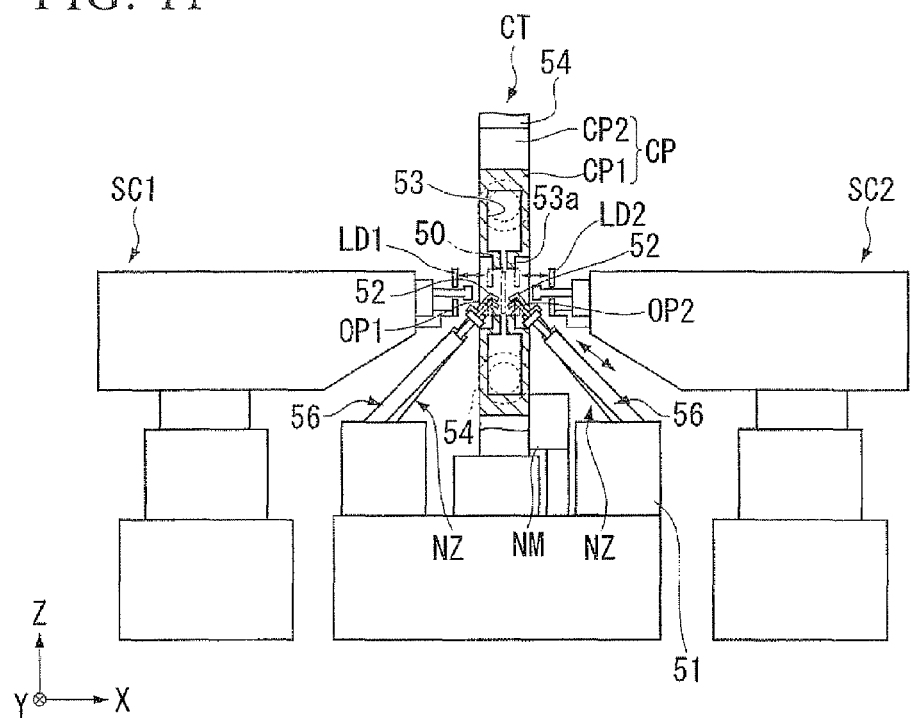
FIG. 11 is a front view illustrating a configuration of a substrate processing unit.
Figure 12:
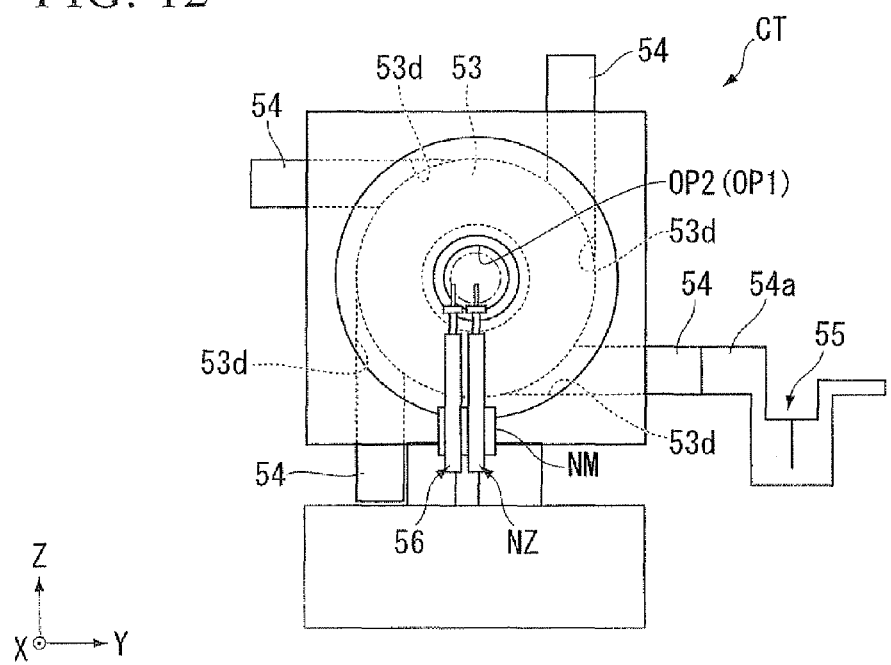
FIG. 12 is a side view illustrating a configuration of the substrate processing unit.
Figure 13:
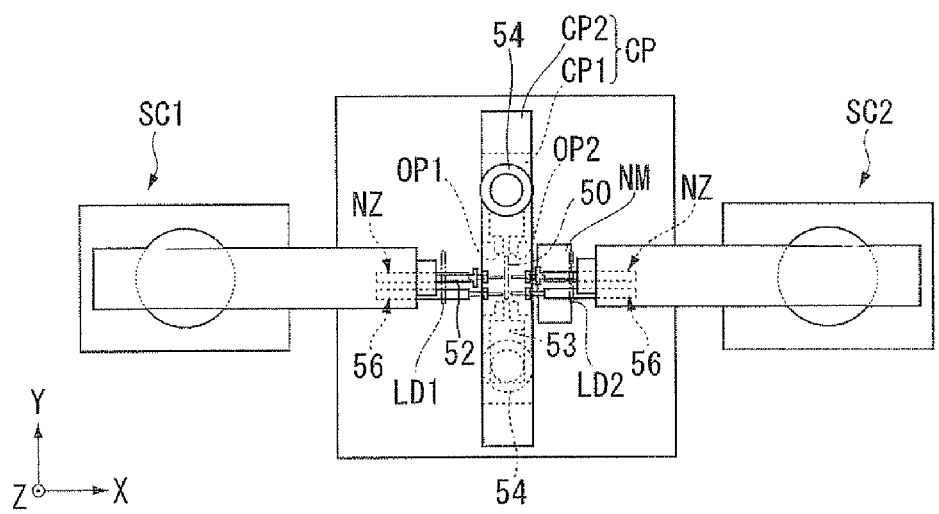
FIG. 13 is a plan view illustrating a configuration of the substrate processing unit.

As shown in FIGS. 1 to 3, the application mechanism CT is disposed substantially at a first position of the center of the substrate processing unit SPU as seen from the plan view, and is fixed to the upper surface of the recessed portion of the stage unit STU. The application mechanism CT is a device which forms a thin coating film on the substrate S by coating a liquid material thereto. In the embodiment, the application mechanism CT forms a thin coating film used for an imprinting process on the substrate S. The substrate may access both the −X side and the +X side of the application mechanism CT. Accordingly, for example, the substrate S may be loaded or unloaded from either the −X side or the +X side. The application mechanism CT performs an application process at an application position 50 (a portion depicted by the dashed line in FIG. 11 and the like) substantially at the center in the X direction. FIGS. 11 to 13 are diagrams illustrating the configuration of the application mechanism CT. The application mechanism CT includes nozzle portions NZ, a cup portion CP, and a nozzle managing mechanism NM.

Figure 14:
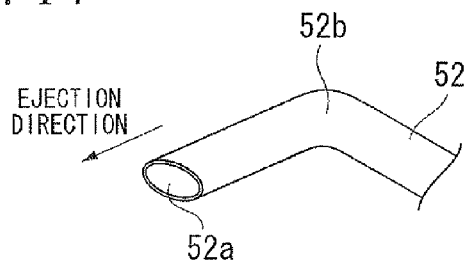
FIG. 14 is a diagram illustrating a configuration of a front end of a nozzle.

Each nozzle portion NZ is configured to access the center of the Y direction of the application position 50 by the nozzle moving mechanism 51. The nozzle portions NZ are disposed at the +X side and the −X side with the application position 50 interposed therebetween. The nozzle portion NZ includes a nozzle 52 which ejects a liquid material forming the thin coating film onto the substrate S. The nozzle 52 is formed to be bent at a bent portion 52b so as to eject a liquid material from the center of the substrate S toward the outer peripheral side thereof when accessing the application position. The nozzle 52 is provided at the −Z side with respect to the rotation axis of the substrate S. The nozzles 52 are disposed at the same position in the first surface side (the +X side) of the substrate S and the second surface side (the −X side) of the substrate S with respect to the application position 50 and are disposed to be symmetrical to each other in the X direction. As shown in FIG. 14, the nozzle 52 is formed so that an ejection surface 52a of the front end thereof is inclined with respect to the ejection direction of the liquid material. Since the front end of the nozzle 52 is formed to be sharp, for example, it is possible to satisfactorily stop the supply of the liquid material when the application of the liquid material is stopped.

The cup portion CP includes an inner cup CP1 and an outer cup CP2. The inner cup CP1 is formed in a circular shape when seen in the X direction, and is disposed to surround the side portion of the substrate S disposed at the application position 50. The outer cup CP2 is formed in a square shape when seen in the X direction, and is disposed to support the inner cup CP1 from the outside thereof. The outer cup CP2 is fixed to the upper surface of the stage unit STU through, for example, the support member and the like.

In the embodiment, the inner cup CP1 and the outer cup CP2 are integrally formed with each other, but may, of course, be formed independently.

As shown in FIGS. 11 to 13, the opening OP1 and OP2 are formed in the inner cup CP1. The opening OP1 and OP2 are configured at the center portion of the inner cup CP1 when seen from the X direction, and are also respectively configured to penetrate a wall portion of the inner cup CP1 in the X direction.

The opening OP1 and OP2 are provided at a position in which the application position 50 of the inner cup CP1 is interposed in the X direction. In the opening OP1 and the opening OP2, the opening OP1 is disposed in the −X direction side, and the opening OP2 is disposed in the +X direction side. The substrate S disposed at the application position 50 is configured to be exposed outside the inner cup CP1 through the opening OP1 and OP2.

The opening OP1 and OP2 are formed, for example, in a circular shape to surround the substrate S. The opening OP1 and OP2 are formed with the same dimensions and the same shape. In addition, the opening OP1 and OP2 are configured, for example, to have larger dimensions than the substrate S, and for example, to have the same dimensions as the cover portion LD1 and LD2 or to have smaller dimensions to the cover portion LD1 and LD2.

The inner cup CP1 includes an accommodation portion 53 which accommodates a liquid material. The accommodation portion 53 is connected to a discharge mechanism 54 which discharges at least one of the liquid material and the gas inside the accommodation portion 53. The discharge mechanism 54 is provided along the tangential direction of the outer periphery of the inner cup CP1 formed in a circular shape. The discharge mechanism 54 is connected to the inside of the accommodation portion 53 of the inner cup CP1 through the outer cup CP2. As shown in FIG. 12, the discharge mechanism 54 is connected to an opening 53d of the inner cup CP1 via a passage of a conduit and the like provided inside the outer cup CP2. In this manner, the discharge mechanism 54 is connected inside the accommodation portion 53 of the inner cup CP1 via the conduit and the opening 53d. The shape of the opening 53d is not limited to, as shown in FIG. 12, the shape along the tangential direction of the inner cup CP1, and may be, for example, the shape along the diameter direction of the inner cup CP1. In this case, for example, four discharge mechanisms 54 may be disposed on the corners of the outer cup CP2, or four discharge mechanisms 54 may be disposed in the middle of the sides of the outer cup CP2. The discharge mechanism 54 is, for example, provided for each side of the outer cup CP2, and the total number thereof is four. As shown in FIG. 12, each discharge mechanism 54 is connected to a discharge path. Each discharge path is provided with a trap mechanism 55 which is a gas-liquid separation mechanism which separates a gas and a liquid. Regarding another discharge mechanism 54 of FIGS. 11 to 13, the discharge path and the trap mechanism 55 are not shown.

Figure 15:
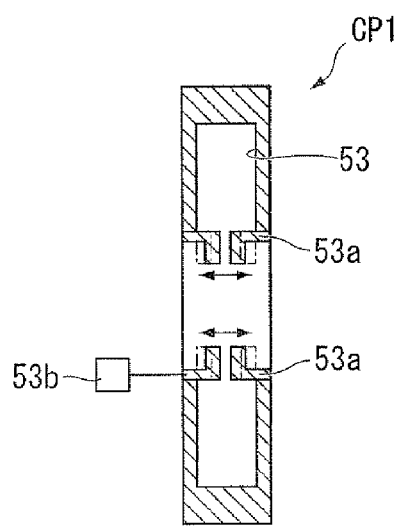
FIG. 15 is a diagram illustrating a configuration of an inner cup.

As the entrance of the accommodation portion 53, the portion 53a facing the side portion of the substrate S in the inner cup CP1 is provided to be attachable to or detachable from other portions of the inner cup CP1. As shown in FIG. 15, the inner cup CP1 includes an adjustment mechanism 53b which adjusts the opening length of the facing portion 53a. By using the adjustment mechanism 53b, for example, the opening length or the rebound state of the application liquid may be adjusted in accordance with the thickness of the substrate S. A second nozzle 56 is provided on the −Y side of the nozzle 52 to eject a cleaning liquid of the cup portion CP.

Figure 16:
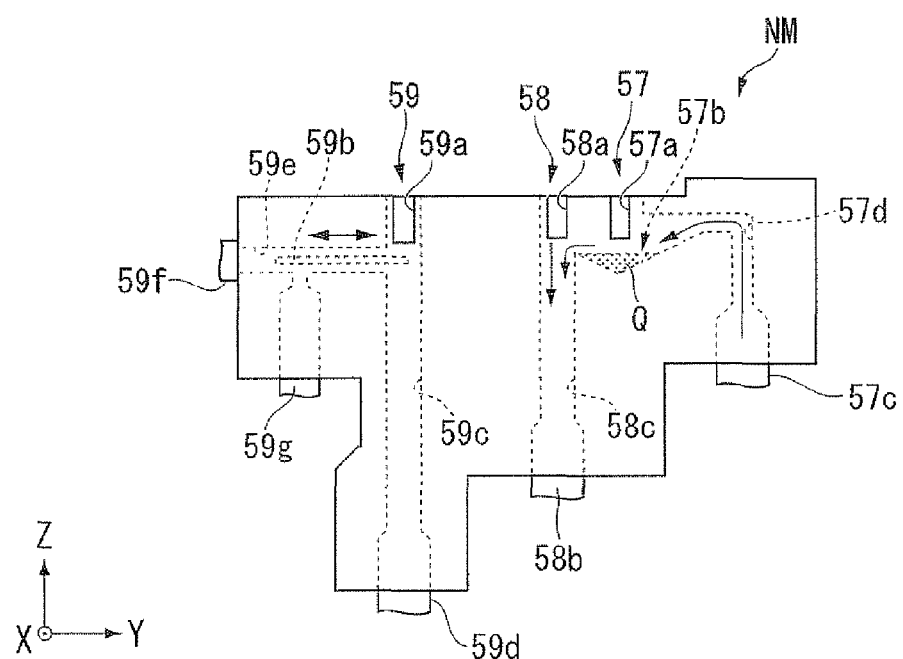
FIG. 16 is a diagram illustrating a configuration of a nozzle managing mechanism.

The nozzle managing mechanism NM manages the ejection state of the nozzle 52 so as to be constant. The nozzle managing mechanism NM is attached to the outer surface of the +X side of the cup portion CP. FIG. 16 is a diagram illustrating a configuration of the nozzle managing mechanism NM when seen in the −X direction. As shown in FIG. 16, the nozzle managing mechanism NM includes a casing BD, an impregnation portion 57, a discharge portion 58, and a preliminary ejection portion 59. The impregnation portion 57, the discharge portion 58, and the preliminary ejection portion 59 are provided for each casing BD, and are integrally formed with each other.

The impregnation portion 57 is a portion which immerses the front end of the nozzle 52 into an impregnation liquid Q in order to prevent the front end of the nozzle 52 from being dried. The impregnation portion 57 includes a nozzle locking portion 57a which locks the nozzle 52, an impregnation liquid storage portion 57b which stores the impregnation liquid Q therein, and an impregnation liquid supply portion 57c which supplies the impregnation liquid Q to the impregnation liquid storage portion 57b through a passage 57d. When the nozzle 52 is locked by the nozzle locking portion 57a, the front end of the nozzle 52 is impregnated with the impregnation liquid Q. As the impregnation liquid Q, for example, a cleaning liquid or the like may be used.

The discharge portion 58 is a portion which discharges the impregnation liquid. The discharge portion 58 includes a nozzle locking portion 58a which locks the nozzle 52 and a suction mechanism 58b which suctions a discharge passage 58c communicating with the impregnation liquid storage portion 57b. When the suction mechanism 58b is operated, the discharge passage 58c in which the front end portion of the nozzle 52 is disposed and the impregnation liquid storage portion 57b are simultaneously suctioned. The discharge portion 58 is disposed at the −Y side of the impregnation portion 57 to communicate with the impregnation portion 57. Since the discharge portion 58 communicates with the impregnation portion 57, the impregnation liquid overflowing from the impregnation portion 57 is discharged therefrom, and the impregnation liquid inside the impregnation portion 57 may be maintained at a constant amount.

The preliminary ejection portion 59 is a portion which discharges a preliminary liquid material from the nozzle 52. The preliminary ejection portion 59 includes a nozzle locking portion 59a which locks the nozzle 52, a preliminary ejection member 59b which is configured to be movable in the Y direction by a moving mechanism (not shown) and receives the liquid material discharged from the nozzle 52, a drain passage 59c and a drain mechanism 59d which discharge part of the liquid material ejected from the nozzle 52, a suction passage 59e which is connected to the drain passage 59c, a suction mechanism 59f which suctions the inside of the suction passage 59e, and a cleaning liquid supply mechanism 59g which supplies a cleaning liquid to the preliminary ejection member 59b. When the preliminary ejection member 59b moves in the Y direction, the +Y-side end portion of the preliminary ejection member 59b may appear to the inside of the drain passage 59c and receive the liquid material ejected from the nozzle 52.

As shown in FIG. 1 and others, the peripheral edge portion removal mechanism EBR is provided at a position which is on the +X direction side of the application mechanism CT and is along the −Y side of the substrate processing unit SPU. The peripheral edge portion removal mechanism EBR is a device which removes the thin coating film formed at the peripheral edge of the substrate S. It is desirable to perform the removal process using the peripheral edge portion removal mechanism EBR while the thin coating film formed on the substrate S is not dried. For this reason, it is desirable to dispose the peripheral edge portion removal mechanism EBR at a position where the substrate S may be carried from the application mechanism CT within a short time. The peripheral edge portion removal mechanism EBR includes, for example, a dip portion (not shown) which dissolves and removes the thin coating film formed at the peripheral edge portion of the substrate S by immersing the peripheral edge portion of the substrate S into a dissolving solution while the substrate S rotates. The peripheral edge portion removal mechanism EBR may be disposed, for example, on the −X direction side of the application mechanism CT (see the one-dotted chain line of FIG. 1).

(Substrate Unloading Unit)

Returning to FIGS. 1 to 3, the substrate unloading unit ULU is disposed at the +X side of the substrate processing unit SPU in the substrate processing system SYS. The substrate unloading unit ULU is a unit in which the unloading cassette C2 accommodating the processed substrate S is collected and to which the empty unloading cassette C2 is supplied. The portion of the substrate unloading unit ULU in the Y direction is formed as a long side, and 2 or more unloading cassettes C2 may be disposed thereon in the Y direction.

The substrate unloading unit ULU includes a cassette entrance 60 and a cassette moving mechanism (a second moving mechanism) 61. The cassette entrance 60 is an opening which is provided at the −Y side of the cover member covering the substrate unloading unit ULU. The cassette entrance 60 is an entrance (a supply opening) of the empty unloading cassette C2 and is an exit (a collection opening) of the unloading cassette C2 accommodating the processed substrate S.

The cassette moving mechanism 61 includes, for example, a driving mechanism such as a belt conveyor mechanism. In the embodiment, a conveyor belt is provided as the driving mechanism. The conveyor belt extends from the +Y-side end portion of the substrate unloading unit ULU to the −Y-side end portion thereof in the Y direction, and two conveyor belts are disposed in the X direction.

The supply belt 61a is a conveyor belt which is disposed at the −X side among the two conveyor belts. The +Z side of the supply belt 61a is used as a carrying surface. The supply belt 61a is configured to rotate so that the carrying surface moves in the +Y direction. 2 or more unloading cassettes C2 entering the substrate unloading unit ULU through the cassette entrance 60, are placed on the carrying surface of the supply belt 61a. The unloading cassettes C2 are configured to move toward the carrying unit CRU through the rotation of the supply belt 61a.

The collecting belt 61b is a conveyor belt which is disposed at the +X side of the two conveyor belts. The +Z side of the collecting belt 61b is used as a carrying surface. The collecting belt 61b is configured to rotate so that the carrying surface moves in the −Y direction. The 2 or more unloading cassettes C2 accommodating the processed substrate S, are placed on the carrying surface of the collecting belt 61b.

The unloading cassette C2 is configured to move toward the cassette entrance 60 through the rotation of the collecting belt 61b.

In the embodiment, for example, the unloading cassette C2 may be disposed in a standby state at five standby positions (container standby portions) on each of the supply belt 61a and the collecting belt 61b. In the substrate unloading unit ULU, the standby position for the unloading cassette C2 may be moved by rotating the supply belt 61a and the collecting belt 61b, and the carrying time of the unloading cassette C2 may be shortened by moving the standby position.

(Carrying Unit)

The carrying unit CRU is disposed at an area along the end of the +Y side inside the substrate processing system SYS, and is configured to contact each of the substrate processing unit SPU, the substrate loading unit LDU, and the substrate unloading unit ULU. The carrying unit CRU carries the loading cassette C1 between the substrate processing unit SPU and the substrate loading unit LDU, and carries the unloading cassette C2 between the substrate processing unit SPU and the substrate unloading unit ULU. The carrying unit CRU includes a rail mechanism RL and a cassette carrying device CC.

The rail mechanism RL is fixed onto the stage unit STU, and extends in a linear shape from the −X-side end portion of the carrying unit CRU to the +X-side end portion thereof. The rail mechanism RL is a guide mechanism which guides the movement position of the cassette carrying device CC. The rail mechanism RL includes two rail members 70 which are disposed in parallel in the Y direction.

The cassette carrying device CC is provided on the two rail members 70 to pass over the two rail members 70 as seen from the plan view. The cassette carrying device CC is a carrying device which accesses each of the buffer mechanism BF of the substrate processing unit SPU, the substrate loading unit LDU, and the substrate unloading unit ULU and holds and carries the loading cassette C1 and the unloading cassette C2. The cassette carrying device CC includes a movable member 71, a cassette support plate 72, a support plate rotation mechanism 73, a cassette holding member 74, a holding member elevation mechanism 75, and a holding member sliding mechanism 76.

The movable member 71 is formed in an H shape as seen from the plan view, and includes a concave portion 71a which is fitted to the two rail members 70. The movable member 71 includes, for example, a driving mechanism (a motor mechanism or the like) (not shown) therein. The movable member 71 is configured to be movable in a linear movement section along the rail members 70 by a driving force of the driving mechanism.

The cassette support plate 72 is a plate-like member which has a rectangular shape as seen from the plan view and is fixed to the movable member 71. The cassette support plate 72 is formed to have a length larger than those of the bottom portions of the loading cassette C1 and the unloading cassette C2, and may stabilize the loading cassette C1 and the unloading cassette C2 while they are placed thereon. Since the cassette support plate 72 is fixed to the movable member 71, the cassette support plate 72 is configured to move together with the movable member 71.

The support plate rotation mechanism 73 is a rotation mechanism which rotates the cassette support plate 72 on the XY plane about the Z axis serving as the rotation axis. The support plate rotation mechanism 73 may change the length directions of the loading cassette C1 and the unloading cassette C2 placed on the cassette carrying device CC by rotating the cassette support plate 72.

The cassette holding member 74 is a holding member which is disposed at the +Y side of the cassette support plate 72 as seen from the plan view and is formed in a U shape as seen from the plan view. The cassette holding member 74 is provided so that the position thereof in the X direction overlaps with the cassette support plate 72. The cassette holding member 74 is supported by the movable member 71 through a support member (not shown), and is configured to be movable together with the movable member 71. Both end portions of the U-shaped portion of the cassette holding member 74 are formed as a holding portion 74a which engages with the engagement portion Cx provided in the loading cassette C1 and the unloading cassette C2. The gap of the holding portion 74a (both end portions of the U-shaped portion) in the X direction is adjustable in accordance with the gap of the engagement portion Cx provided in the loading cassette C1 and the unloading cassette C2. The cassette holding member 74 may further reliably hold the loading cassette C1 and the unloading cassette C2 in the Z direction in a manner such that the holding portion 74a engages with the engagement portion Cx.

The holding member elevation mechanism 75 is a moving mechanism which is provided in the cassette holding member 74 and moves the cassette holding member 74 in the Z direction. As the holding member elevation mechanism 75, for example, a driving mechanism such as an air cylinder may be used. When the cassette holding member 74 is moved in the +Z direction by the holding member elevation mechanism 75, the loading cassette C1 and the unloading cassette C2 held by the cassette holding member 74 may be lifted. Conversely, when the cassette holding member 74 is moved in the −Z direction by the holding member elevation mechanism 75, the lifted cassette may be placed.

The holding member sliding mechanism 76 is a moving mechanism which is provided in the cassette holding member 74 and moves the cassette holding member 74 in the Y direction. The holding member sliding mechanism 76 includes a guide bar 76b which extends in the Y direction and a movable member 76a which moves along the guide bar 76b. The movable member 76a is fixed to the cassette holding member 74. When the movable member 76a moves along the guide bar 76b in the Y direction, the cassette holding member 74 moves together with the movable member 76a in the Y direction.

(Control Unit)

The control unit CNU is provided inside the stage unit STU of the substrate processing system SYS. The control unit CNU includes, for example, a control device controlling all operations of the units such as a substrate processing operation of the substrate processing unit SPU, a cassette movement operation of the substrate loading unit LDU or the substrate unloading unit ULU, and a carrying operation of the carrying unit CRU, and a supply source necessary for the materials of the units. As the supply source of the material, for example, a liquid material supply source, a cleaning liquid supply source, or the like may be mentioned.

Next, an operation of the substrate processing system SYS with the above-described configuration will be described. The operation performed in each unit of the substrate processing system SYS is controlled by the control unit CNU.

In the following description, the unit performing the operation is mainly described, but the operation is practically performed based on the control of the control unit CNU.

(Cassette Supply Operation)

First, a cassette supply operation will be described in which the loading cassette C1 accommodating the unprocessed substrate S is disposed at the substrate loading unit LDU, and the empty unloading cassette C2 is disposed at the substrate unloading unit ULU.

For example, the loading cassette C1 accommodating the unprocessed substrate S is supplied into the substrate loading unit LDU through the cassette entrance 10 by a supply mechanism or the like (not shown). The substrate loading unit LDU sequentially supplies the loading cassette C1 while rotating the supply belt 11a. By this operation, 2 or more loading cassettes C1 accommodating the unprocessed substrates S are disposed inside the substrate loading unit LDU.

On the other hand, for example, the empty unloading cassette C2 is supplied into the substrate unloading unit ULU through the cassette entrance 60 by the supply device or the like (not shown). The substrate unloading unit ULU sequentially supplies the unloading cassette C2 while rotating the supply belt 61a. By this operation, 2 or more empty unloading cassettes C2 are disposed inside the substrate unloading unit ULU.

(Cassette Carrying Operation)

Next, the loading cassettes C1 supplied to the substrate loading unit LDU and the unloading cassettes C2 supplied to the substrate unloading unit ULU are carried to each substrate processing unit SPU. This cassette carrying operation is performed by using the cassette carrying device CC provided in the carrying unit CRU.

The operation of carrying the loading cassette C1 will be described. The carrying unit CRU receives the loading cassette C1 by allowing the cassette carrying device CC to access the substrate loading unit LDU, and moves the cassette carrying device CC to the loading-side buffer mechanism BF1.

After the movement of the cassette carrying device CC, the carrying unit CRU places the loading cassette C1 at the standby position P1 of the loading-side buffer mechanism BF1. After receiving the loading cassette, the substrate loading unit LDU moves the supply belt 11a, and entirely moves the other loading cassettes C1 in the +Y direction. Since the space at the −Y-side end portion on the supply belt 11a becomes empty due to the movement of the loading cassette C1, a new loading cassette C1 is supplied to the empty space by the supply device (not shown).

In the same manner, as for the operation of carrying the unloading cassette C2, the carrying unit CRU receives the unloading cassette C2 by allowing the cassette carrying device CC to access the substrate unloading unit ULU, and moves the cassette carrying device CC to the unloading-side buffer mechanism BF2. After the movement of the cassette carrying device CC, the carrying unit CRU places the unloading cassette C2 at the standby position P5 of the unloading-side buffer mechanism BF2. After receiving the unloading cassette, the substrate unloading unit ULU moves the supply belt 61a, and entirely moves the other unloading cassettes C2 in the +Y direction. Since the space of the −Y-side end portion on the supply belt 61a becomes empty due to the movement of the unloading cassette C2, a new unloading cassette C2 is supplied to the empty space by the supply device (not shown).

(Substrate Processing Operation)

Next, the processing operation at the substrate processing unit SPU will be described.

The substrate processing unit SPU performs an operation of moving the loading cassette C1 accommodating the unprocessed substrate S and the empty unloading cassette C2, an operation of loading the substrate S accommodated in the loading cassette C1, an operation of coating a liquid material onto the substrate S, a peripheral edge portion removal operation of removing the peripheral edge portion of the thin coating film formed on the substrate S, an operation of unloading the processed substrate S, an operation of moving the empty loading cassette C1 and the unloading cassette C2 accommodating the processed substrate S, a maintenance operation of the nozzle portion NZ, and a maintenance operation of the cup portion CP. In addition to each operation, the operation of carrying the substrate S is performed between the loading operation and the application operation, between the application operation and the peripheral edge portion removal operation, and between the peripheral edge portion removal operation and the unloading operation.

Among these operations, first, the operation of moving the loading cassette C1 and the unloading cassette C2 will be described. The substrate processing unit SPU moves the loading cassette C1 carried to the standby position P1 of the loading-side buffer mechanism BF1 to the standby position P2, and further moves the loading cassette C1 moved to the standby position P2 to the standby position P4.

The substrate processing unit SPU moves the cassette carrying arm 20b from the −Z side of the cassette placing member 20a toward the +Z side thereof while the loading cassette C1 is placed on the cassette placing member 20a provided at, for example, the standby position P1. By this operation, the cassette carrying arm 20b receives the loading cassette C1, so that the loading cassette C1 is lifted with respect to the cassette placing member 20a.

The substrate processing unit SPU moves the cassette carrying arm 20b receiving the loading cassette C1 in the +X direction, and stops the movement at the standby position P2. After the movement is stopped, the substrate processing unit SPU moves the cassette carrying arm 20b in the −Z direction of the cassette placing member 20a. By this operation, the cassette carrying arm 20b gives the loading cassette C1 to the cassette placing member 20a, and the cassette carrying arm 20b moves toward the −Z side of the cassette placing member 20a. In this manner, the loading cassette C1 is disposed at the standby position P2.

After the loading cassette C1 is moved from the standby position P1 to the standby position P2, the substrate processing unit SPU moves the cassette carrying arm 20b toward the −Z side of the cassette placing member 20a, and moves the cassette carrying arm 20b in the −X direction. By this operation, the cassette carrying arm 20b is returned to the original position (the standby position P1). At the same time, the substrate processing unit SPU moves the cassette carrying arm 20b disposed at the standby position P3 in the −X direction. By this operation, the cassette carrying arm 20b is disposed at the −Z side of the cassette placing member 20a of the standby position P2.

The substrate processing unit SPU moves the cassette placing member 20a to the standby position P4 while the loading cassette C1 is placed on the cassette placing member 20a at the standby position P2. By this operation, the loading cassette C1 moves from the standby position P2 to the standby position P4. In this case, only the cassette placing member 20a moves to the standby position P2 without moving the cassette carrying arm 20b disposed at the standby position P2. After the substrate S is processed at the standby position P4, the substrate processing unit SPU moves the cassette placing member 20a from the standby position P4 to the standby position P2. By this operation, the loading cassette C1 is returned to the standby position P2.

In the same manner, the substrate processing unit SPU moves the unloading cassette C2 carried to the standby position P5 of the unloading-side buffer mechanism BF2 to the standby position P6, and further moves the unloading cassette C2 which was moved to the standby position P6 to the standby position P8. By these operations, the loading cassette C1 and the unloading cassette C2 carried into the substrate processing unit SPU are disposed at a process start position.

Next, the operation of loading the substrate S will be described. After the substrate processing unit SPU confirms that the loading cassette C1 is disposed at the standby position P4, the upper substrate portion holding mechanism 23 is disposed at the clamping position, and the elevation member 24a of the lower substrate portion holding mechanism 24 is moved in the +Z direction. By this movement, the clamping member 24b attached to the +Z-side end portion of the elevation member 24a comes into contact with the −Z side of one substrate S disposed closest to the −Y side of the substrates S accommodated in the loading cassette C1, and the −Z side of the substrate S is held by the clamping member 24b.

After the −Z side of the substrate S is held, the substrate processing unit SPU further moves the elevation member 24a in the +Z direction while maintaining the holding state. By this movement, the substrate S is lifted toward the +Z side by the lower substrate portion holding mechanism 24, the +Z side of the substrate S comes into contact with the clamping member 23b of the upper substrate portion holding mechanism 23, and the +Z side of the substrate S is held by the clamping member 23b. The substrate S is held by both the clamping member 23b of the upper substrate portion holding mechanism 23 and the clamping member 24b of the lower substrate portion holding mechanism 24.

The substrate processing unit SPU simultaneously moves the elevation member 23a and the elevation member 24a in the +Z direction while holding the substrate S by the clamping member 23b and the clamping member 24b.

The substrate processing unit SPU synchronizes the movements of the elevation mechanism 23c and the elevation mechanism 24c so that the elevation member 23a and the elevation member 24a move at the same speed. The substrate S moves in the +Z direction while being held by the clamping member 23b and the clamping member 24b.

When the substrate S is disposed at the loading position LP, the substrate processing unit SPU stops the movements of the elevation member 23a and the elevation member 24a. In this manner, the operation of loading the substrate S is performed.

After the loading operation, the substrate processing unit SPU allows the holding portion 32 of the loading-side carrying mechanism SC1 to access the loading position LP, and holds the substrate S disposed at the loading position LP by the holding portion 32. When the holding portion 32 is allowed to access the loading position LP, the substrate processing unit SPU rotates the rotation table 30b to direct the front end surface 31b of the arm portion 31 toward the +Y side and drives the motor device 35a to move the arm portion 31 in the Y direction. In accordance with the movement of the arm portion 31, the holding portion 32 attached to the front end surface 31b of the arm portion 31 accesses the loading position LP.

After the holding portion 32 accesses the loading position, the substrate processing unit SPU operates the suction pump 34a to suction and hold the substrate S via the holding portion 32. By this operation, the substrate S is held upright in the Z direction by the holding portion 32. After the substrate S is held upright by the holding portion 32, the substrate processing unit SPU releases the holding force using the clamping member 23b and the clamping member 24b and allows the substrate S to be held by only the holding portion 32. In this state, the substrate processing unit SPU releases the holding force to retreat the clamping member 23b and the clamping member 24b in the −Z direction.

After the clamping members 23b and 24b retreat, the substrate processing unit SPU rotates the rotation table 30b of the loading-side carrying mechanism SC1, and carries the substrate S while the substrate S is held upright in the Z direction, and disposes the substrate S at the application position 50 inside the inner cup CP1 of the application mechanism CT. At this time, the substrate S held by the holding portion 32 is disposed at the application position 50 through the opening OP1 provided in the inner cup CP1.

Figure 17:
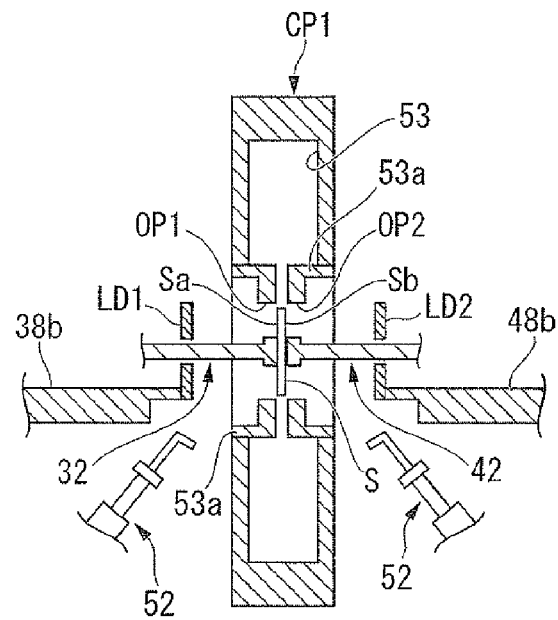
FIG. 17 is a diagram illustrating an operation of a substrate processing unit.

After the substrate S is disposed at the application position 50, the substrate processing unit SPU rotates a rotation table 40b of the unloading-side carrying mechanism SC2 to access a holding portion 42 to the second surface Sb of the substrate S disposed at the application position 50. After the holding portion 42 accesses the second surface Sb of the substrate S, the substrate processing unit SPU operates a suction pump 44a to suction the substrate S to the holding portion 42. By the operation, as shown in FIG. 17, the first surface Sa of the substrate S disposed at the application position 50 is held by the holding portion 32, and the second surface Sb of the substrate S is held by the holding portion 42.

Next, the operation of coating the liquid material onto the substrate S will be described. In this application operation, the application mechanism CT is used. The substrate processing unit SPU rotates the substrate S at a high speed while the substrate S is held upright in the Z direction, and allows the nozzle 52 provided in the application mechanism CT to access the application position 50 so that the liquid material is ejected from the nozzle 52 onto the substrate S.

Specifically, the substrate processing unit SPU operates the motor device 33a and 43a while the substrate S is disposed at the application position 50. By the action of the motor device 33a and 43a, the rotation shaft member 33b and 43b rotates, and the holding portion 32 and 42 held by the rotation shaft member 33b and 43b rotates together with the rotation shaft member 33b and 43b respectively. By this operation, both of the first surface Sa and the second surface Sb are held, and then the substrate S rotates while being upright in the Z direction.

Figure 18:
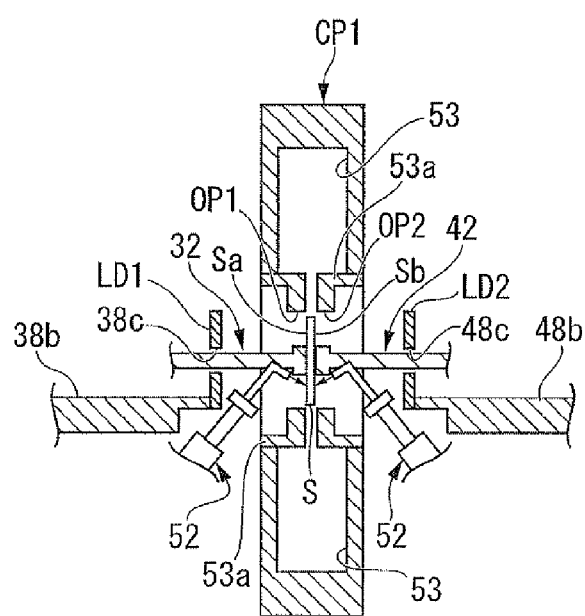
FIG. 18 is a diagram illustrating an operation of a substrate processing unit.

After the substrate S rotates, as shown in FIG. 18, the substrate processing unit SPU allows the nozzles 52 at the +X side and the −X side of the application position 50 to access each substrate S, and ejects the liquid material from the nozzles 52 to the first surface Sa and the second surface Sb of the substrate S. The ejected liquid material is widely spread up to the outer periphery of the substrate S by the centrifugal force of the rotation, so that the thin coating film is formed on both surfaces of the substrate S. The substrate processing unit SPU keeps the opening OP1 and OP2 open while the liquid material is applied by accessing the nozzle 52 to the substrate S.

Since each nozzle 52 is disposed at a position out of the rotation axis of the substrate S, the nozzle 52 is disposed without contacting the holding portion 32 or the arm portion 31. Furthermore, since each nozzle 52 ejects the liquid material from the rotation axis of the substrate S toward the outer periphery of the substrate S, the movement of the liquid material toward the center of the substrate S is suppressed.

Figure 19:
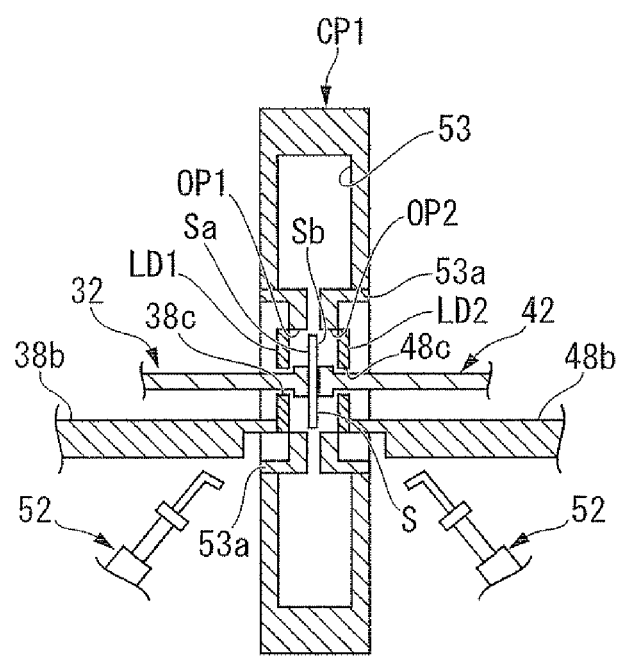
FIG. 19 is a diagram illustrating an operation of a substrate processing unit.

After the liquid material is applied to the substrate S, the substrate processing unit SPU retreats each nozzle 52 from the substrate S. After the nozzle 52 is retreated, the substrate processing unit SPU, as shown in FIG. 19, respectively moves the cover portion LD1 and LD2 to the side of the substrate S along the holding portion 32 and 42 to block the opening OP1 and OP2. In this state, the substrate processing unit SPU forms a coating film on the first surface Sa and the second surface Sb so that the liquid material is spread on substantially entire surfaces of the first surface Sa and the second surface Sb while rotating the substrate S.

As shown in FIG. 19, since the first surface Sa of the substrate S is covered by the cover portion LD1 and the second surface Sb of the substrate S is covered by the cover portion LD2, the substrate S is not exposed outside the inner cup CP1, and an air tightness around the substrate S inside the inner cup CP1 is further enhanced. Therefore, for example, since a solvent component of the liquid material and the like is accommodated inside the inner cup CP1, the liquid material applied to the substrate S (or coating liquid) can be prevented from rapidly drying.

In forming the coating film, the liquid material scattered over the substrate S by the rotation of the substrate S after the liquid material is ejected onto the substrate S is accommodated in the accommodation portion 53 through the opening formed in the facing portion 53a of the inner cup CP1. In the inside of the accommodation portion 53, the streams of the gas and the liquid material are generated in the rotation direction of the substrate S due to the rotation thereof. The liquid material and the gas are discharged to the discharge path through the discharge mechanism 54 connected to the outer cup CP2 along the streams. The liquid material and the gas discharged to the discharge path are separated from each other by the trap mechanism 55 so that the gas passes the inside of the trap mechanism 55 and the liquid material remains inside the trap mechanism 55. The liquid material remaining inside the trap mechanism 55 is discharged through a discharge portion (not shown).

After the coating operation, the substrate processing unit SPU controls the cover portion LD1 and LD2 so as to retreat from the inner cup CP1 to open the opening OP1 and OP2.

The substrate processing unit SPU stops the operation of the suction pump 34a, releases the holding portion 32 of the loading-side carrying mechanism SC1 holding the first surface Sa, and maintains the holding portion 42 of the unloading-side carrying mechanism SC2 holding the second surface Sb. By the operation, the substrate S is only held by the holding portion 42 of the unloading-side carrying mechanism SC2. In this manner, the substrate S is transferred from the loading-side carrying mechanism SC1 to the unloading-side carrying mechanism SC2.

Next, the peripheral edge portion removal operation of removing the thin coating film formed on the periphery of the substrate S will be described. In the peripheral edge portion removal operation, the peripheral edge portion removal mechanism EBR is used. The substrate processing unit SPU immerses the peripheral edge portion of the substrate S disposed inside the peripheral edge portion removal mechanism EBR into the dissolving solution in the dip portion, and when the substrate S is rotated in this state, the thin coating film of the peripheral edge portion immersed into the dissolving solution is dissolved and removed.

After the peripheral edge portion removal operation, the substrate processing unit SPU moves the elevation member 25a so that the clamping member 25b of the upper substrate portion holding mechanism 25 is located at the +Z side of the unloading position UP. After the movement of the elevation member 25a, the substrate processing unit SPU rotates the rotation table 40b while the substrate S is held by the holding portion 42 of the unloading-side carrying mechanism SC2 and appropriately extends or shortens the arm portion 41 to allow the holding portion 42 to access the unloading position UP. By this operation, the substrate S is disposed at the unloading position UP.

Next, the operation of unloading the substrate S will be described. After it is confirmed that the substrate S is disposed at the unloading position UP, the substrate processing unit SPU moves the elevation member 25a of the upper substrate portion holding mechanism 25 in the −Z direction and moves the elevation member 26a of the lower substrate portion holding mechanism 26 in the +Z direction. By this movement, the clamping member 25b attached to the −Z side of the elevation member 25a comes into contact with the +Z side of the substrate S, the clamping member 26b attached to the +Z-side end portion of the elevation member 26a comes into contact with the −Z side of the substrate S, and the +Z side and the −Z side of the substrate S are respectively held by the clamping member 25b and the clamping member 26b.

After it is confirmed that the substrate S is held by both the clamping member 25b and the clamping member 26b, the substrate processing unit SPU stops the operation of the suction pump 44a of the unloading-side carrying mechanism SC2 and releases a state where the substrate S is held by the holding portion 42. By this operation, the substrate S is held by only the clamping member 25b and the clamping member 26b. The substrate processing unit SPU simultaneously moves the elevation member 25a and the elevation member 26a in the −Z direction while the substrate S is held by the clamping member 25b and the clamping member 26b. The substrate processing unit SPU synchronizes the movements of the elevation mechanism 25c and the elevation mechanism 26c so that the elevation member 25a and the elevation member 26a move at the same speed. The substrate S moves in the −Z direction while being held by the clamping member 25b and the clamping member 26b.

When the protrusion portion of the elevation member 25a becomes close to the unloading cassette C2, the substrate processing unit SPU releases the holding force using the clamping member 25b and moves only the elevation member 26a in the −Z direction by stopping the movement of the elevation member 25a. The substrate S moves in the −Z direction while being held by only the holding force of the clamping member 26b.

The substrate processing unit SPU maintains the holding operation of the clamping member 26b until the substrate S reaches the accommodation position inside the unloading cassette C2. After the substrate S reaches the accommodation position, the substrate processing unit SPU releases the holding operation of the clamping member 26b and moves the elevation member 26a in the −Z direction. By this operation, the substrate S is accommodated in the unloading cassette C2.

In the description of the operations, the operations are sequentially performed on one substrate S located closest to the −Y side of the substrates S accommodated in the loading cassette C1, but in fact, the operations are continuously performed on 2 or more substrates S. In this case, the substrate processing unit SPU moves the cassette placing member 20a in the −Y direction so that the substrate S located closest to the −Y side of the other substrates S accommodated in the loading cassette C1 overlaps the loading position LP as seen from the plan view while the loading cassette C1 is placed thereon.

In the same manner, the substrate processing unit SPU moves the cassette placing member 20a in the +Y direction so that the accommodation position closest to the −Y side among the accommodation positions inside the unloading cassette C2 overlaps with the unloading position UP as seen from the plan view while the unloading cassette C2 is placed thereon. The substrate processing unit SPU repetitively performs the operations while moving the loading cassette C1 and the unloading cassette C2 as described above.

When the process is performed in parallel on the 2 or more substrates S, the substrate processing unit SPU performs the process in parallel on the 2 or more substrates S. Specifically, the process is performed on the 2 or more substrates S in a manner such that the peripheral edge portion removal operation is performed on one substrate S while the application operation is performed on another substrate S and other substrates S are loaded or unloaded. When the process is performed in parallel in this manner, it is possible to maximally shorten the standby time of the substrate S and to shorten the process tact time of the substrate S.

When the process of all substrates S accommodated inside the loading cassette C1 is completed, the loading cassette C1 becomes empty, and all accommodation positions of the unloading cassette C2 waiting at the standby position P8 are filled with the processed substrates S. After this state is confirmed by the substrate processing unit SPU, the substrate processing unit SPU moves the cassette placing member 20a in the reversed direction (in the +Y direction) and moves the loading cassette C1 from the standby position P4 to the standby position P2. Further, the substrate processing unit SPU moves the loading cassette C1 moved to the standby position P2 to the standby position P3 by using the cassette carrying arm 20b.

In the same manner, the substrate processing unit SPU moves the cassette placing member 20a in the reverse direction (the +Y direction) and moves the unloading cassette C2 from the standby position P8 to the standby position P6.

Further, the substrate processing unit SPU moves the unloading cassette C2 moved to the standby position P6 to the standby position P7 by using the cassette carrying arm 20b.

Next, the operation of performing the maintenance of the nozzle portion NZ and the cup portion CP of the application mechanism CT will be described. When the application operation is performed multiple times, an impurity such as a solidified material of the liquid material or dust in the atmosphere is attached to the nozzle portion NZ or the cup portion CP. For example, the impurity may block the nozzle 52 to degrade the ejection characteristics or block the discharge path inside the cup portion CP. Further, in the ejection operation, the ejection environment of the nozzle 52 needs to be managed so that it is not changed. Accordingly, it is necessary to periodically perform the maintenance operation of the nozzle portion NZ and the cup portion CP.

In the operation of performing the maintenance of the nozzle portion NZ, the nozzle managing mechanism NM is used. When the nozzle 52 is cleaned, the substrate processing unit SPU moves the nozzle portion NZ so that the nozzle 52 accesses the nozzle managing mechanism NM. The substrate processing unit SPU fits the nozzle 52 into the nozzle locking portion 57a corresponding to the impregnation portion 57. By this operation, the front end portion of the nozzle 52 is impregnated with the impregnation liquid Q inside the impregnation liquid storage portion 57b. For this reason, the front end portion of the nozzle 52 is moisturized by the impregnation liquid Q.

After the front end portion of the nozzle 52 is impregnated with the impregnation liquid, the substrate processing unit SPU separates the nozzle 52 fitted to the nozzle locking portion 57a and moves the nozzle 52 to the discharge portion 58. The substrate processing unit SPU fits the moved nozzle 52 to the nozzle locking portion 58a corresponding to the discharge portion 58. By this operation, the front end portion of the nozzle 52 is inserted into the discharge passage 58c. In this state, the substrate processing unit SPU operates the suction mechanism 58b. By the operation of the suction mechanism 58b, the discharge passage 58c and the impregnation liquid storage portion 57b communicating with the discharge passage 58c are suctioned. The impurity such as the cleaning liquid remaining in the nozzle 52 is removed by the suction operation.

After the suction operation, the nozzle 52 fitted to the nozzle locking portion 58a is separated, and the nozzle 52 is moved to the preliminary ejection portion 59. The substrate processing unit SPU fits the moved nozzle 52 to the nozzle locking portion 59a corresponding to the preliminary ejection portion 59. Next, the substrate processing unit SPU operates the drain mechanism 59d and the suction mechanism 59f and protrudes the +Y-side end portion of the preliminary ejection member 59b of the preliminary ejection portion 59 into the drain passage 59c. In this state, the substrate processing unit SPU preliminarily ejects the liquid material from the nozzle 52 to the preliminary ejection member 59b. Subsequently, the substrate processing unit SPU cleans the preliminary ejection member 59b. The ejection environment of the nozzle 52 is adjusted by a series of preliminary ejection operations of the nozzle 52.

Next, the operation of performing the maintenance of the cup portion CP will be described. When the cup portion CP is cleaned, the second nozzle 56 is used. The substrate processing unit SPU allows the second nozzles 56 to access the +X side and the −X side of the substrate S instead of the nozzles 52 while the substrate S rotates when performing the application operation, and ejects the cleaning liquid from each second nozzle 56 to the substrate S. The cleaning liquid ejected onto the substrate S moves to the peripheral edge portion of the substrate S due to the centrifugal force of the rotation, and is scattered from the peripheral edge portion of the substrate S toward the inner cup CP1. The scattered cleaning liquid is accommodated inside the accommodation portion 53 through the opening of the facing portion 53a. In this manner, when the cleaning liquid is ejected from the cleaning liquid nozzle portion 56, the substrate processing unit SPU rotates the substrate S. By the operation, a stream of the cleaning liquid may be formed inside the accommodation portion 53 and it becomes possible to clean the inside of the accommodation portion 53 and the discharge path by the stream of the cleaning liquid. Similarly to the liquid material, the cleaning liquid which has cleaned the inside of the accommodation portion 53 is discharged so that the gas and the liquid are separated from each other at the trap mechanism 55.

For example, the operation of cleaning the cup portion CP may be performed while the facing portion 53a of the accommodation portion 53 is separated. Additionally, at a time other than the cleaning operation, for example, the facing portion 53a may be separated to separately clean the facing portion 53a, or the facing portion 53a may be separated to perform the maintenance of other portions of the cup portion CP.

(Cassette Carrying Operation)

Next, the cassette carrying operation will be described which carries the empty loading cassette C1 to the substrate loading unit LDU and carries the unloading cassette C2 accommodating the processed substrate S to the substrate unloading unit ULU.

The operation of carrying the loading cassette C1 will be described. The carrying operation is performed by using the cassette carrying device CC that is used for the above-described carrying operation. The carrying unit CRU moves the cassette carrying device CC up to the loading-side buffer mechanism BF1 of the substrate processing unit SPU, and receives the empty loading cassette C1 waiting at the standby position P3 by using the cassette carrying device CC.

After the loading cassette C1 is received, the carrying unit CRU moves the cassette carrying device CC toward the substrate loading unit LDU in the −X direction. After the movement, the carrying unit CRU places the empty loading cassette C1 placed on the cassette support plate 72 on the +Y-sided end portion of the collecting belt 11b, and controls the cassette holding member 74 so as to retreat to the +Y side.

The operation of carrying the unloading cassette C2 will be described. The carrying operation is performed by using the cassette carrying device CC as in the operation of carrying the loading cassette C1. The carrying unit CRU moves the cassette carrying device CC up to the unloading-side buffer mechanism BF2 of the substrate processing unit SPU in the X direction, and receives the unloading cassette C2 waiting at the standby position P7 by using the cassette carrying device CC.

After the unloading cassette C2 is received, the carrying unit CRU moves the cassette carrying device CC toward the substrate unloading unit ULU in the +X direction. After the movement, the carrying unit CRU places the unloading cassette C2 placed on the cassette support plate 72 on the +Y-side end portion of the collecting belt 61b, and controls the cassette holding member 74 so as to retreat to the +Y side.

(Cassette Collecting Operation)

Next, the operation of collecting the empty loading cassette C1 and the unloading cassette C2 accommodating the processed substrate S will be described.

After the substrate loading unit LDU confirms that the empty loading cassette C1 is carried thereto, the substrate loading unit LDU rotates the collecting belt 11b and carries the loading cassette C1 to the outside of the substrate loading unit LDU through the cassette entrance 10. This operation is repeated when the loading cassette C1 is carried to the substrate loading unit LDU.

In the same manner, after the substrate unloading unit ULU confirms that the unloading cassette C2 accommodating the processed substrate S is carried thereto, the substrate unloading unit ULU rotates the collecting belt 61b to move in the −Y direction and carries the unloading cassette C2 to the outside of the substrate unloading unit ULU through the cassette entrance 60. This operation is repeated when the unloading cassette C2 is carried to the substrate unloading unit ULU.

(Cassette Supplementing Operation)

After the carrying unit CRU confirms that the standby position P1 and the standby position P5 are empty, the carrying unit CRU carries the next loading cassette C1 and the next unloading cassette C2 to the standby position P1 and the standby position P5 by using the cassette carrying device CC. First, the carrying unit CRU moves the cassette carrying device CC up to the substrate loading unit LDU to receive the next loading cassette C1. After the loading cassette C1 is received, the carrying unit CRU moves the cassette carrying device CC up to the loading-side buffer mechanism BF1 and places the received loading cassette C1 at the standby position P1. In the same manner, the carrying unit CRU moves the cassette carrying device CC to the substrate unloading unit ULU to receive the next unloading cassette C2, and then moves the cassette carrying device CC to the unloading-side buffer mechanism BF2 to place the unloading cassette C2 at the standby position P5.

For example, when the loading cassette C1 moves from the standby position P1 to the standby position P2 and the unloading cassette C2 moves from the standby position P5 to the standby position P6 after performing the application operation, the standby position P1 and the standby position P5 become empty again. The next loading cassette C1 and the next unloading cassette C2 may be carried to wait at the empty standby position P1 and the empty standby position P5. In this manner, whenever the standby position P1 and the standby position P5 of the loading-side buffer mechanism BF1 and the unloading-side buffer mechanism BF2 become empty, the carrying unit CRU carries the loading cassette C1 from the substrate loading unit LDU and carries the unloading cassette C2 from the substrate unloading unit ULU.

As described above, according to the embodiment, since the cover portion LD1 and LD2 by which the opening OP1 and OP2 of the cup portion CP is opened and closed can block the inside of the cup portion CP for the outside, the air tightness inside the cup portion can be ensured. Accordingly, since in the application of the liquid material to the substrate S inside the cup portion CP, the inside of the cup portion CP can be prevented from being dried, the coating film of the liquid material can be formed with a uniform thickness, and a degradation in the yield can be prevented.

Further, according to the embodiment, when the first surface Sa and second surface Sb of the substrate S are held by the loading-side carrying mechanism SC1 and the unloading-side carrying mechanism SC2, it is possible to make the environmental state such as the air stream at the side of the first surface Sa and the second surface Sb of the substrate S substantially the same. Since the state at both surfaces of the substrate S is adjusted, it is possible to prevent a difference in quality of the coating film applied to both surfaces of the substrate S.

The technical scope of the invention is not limited to the above-described embodiment, but may be appropriately modified within the scope not departing from the spirit of the invention.

Figure 20:
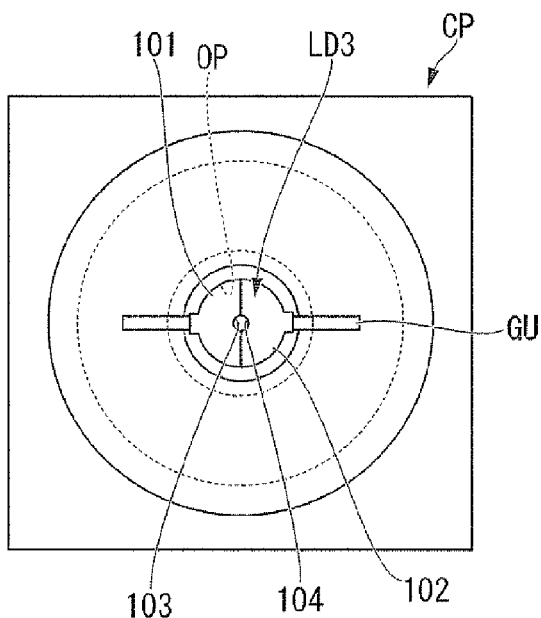
FIG. 20 is a diagram illustrating another configuration of a substrate processing unit.
Figure 21:
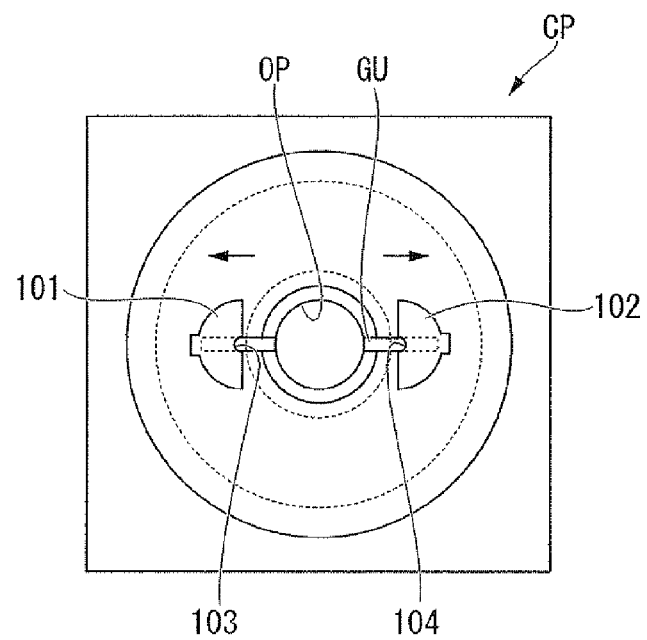
FIG. 21 is a diagram illustrating another configuration of a substrate processing unit.

For example, in the above-described embodiment, a configuration has been described in which the cover portion LD1 and LD2 is disposed on the loading-side carrying mechanism SC1 and the unloading-side carrying mechanism SC2, but the invention is not limited thereto. A configuration may be adopted in which the cover portion may be provided in the cup portion. For example, as shown in FIGS. 20 and 21, a cover portion LD3 is provided in the cup portion CP.

The cover portion LD3 includes a first member 101 and a second member 102. The first member 101 and the second member 102 are a plate-like members formed in a semicircular shape. By joining each straight line portion of the first member 101 and the second member 102, an opening OP of the cup portion CP is capable of being blocked. The first member 101 and the second member 102 are connected to, for example, a driving mechanism (not shown), and for example, the first member 101 and the second member 102 are provided to be independently movable.

The cup portion CP is provided with a guide rail GU. The guide rail GU is extended from the opening OP to the peripheral edge portion of the cup portion CP, for example, in the left/right direction of the drawings. The first member 101 and the second member 102 are attached to the guide rail GU. The first member 101 and the second member 102 are movable along the guide rail GU. For example, as shown in FIG. 21, when the first member 101 and the second member 102 are divided and move along the guide rail GU in the direction apart from each other, the opening OP is opened. For example, in the case of loading the substrate S into the cup portion CP and the like, by moving the first member 101 and the second member 102 in this manner, the opening OP is opened.

A concave portion 103 and 104 are formed in each straight line portion of the first member 101 and the second member 102. The concave portion 103 and 104 are formed to be an opening in which the holding portion 32 or 42 is passed while each straight line portion of the first member 101 and the second member 102 are joined. In this manner, since the cover portion LD3 is provided in the cup portion CP, for example, a support portion and the like supporting the cover portion LD3 is not separately provided and the number of components can be reduced. In FIGS. 20 and 21, a configuration has been described in which the guide rail GU is provided in the left/right direction of the drawings, and the first member 101 and the second member 102 are divided and move in the left/right direction of the drawings, but the invention is not limited thereto. For example, a configuration may be adopted in which the guide rail GU may be extended in the up/down direction of the drawings, and the first member 101 and the second member 102 are divided and move in the up/down direction of the drawings.

Figure 22:
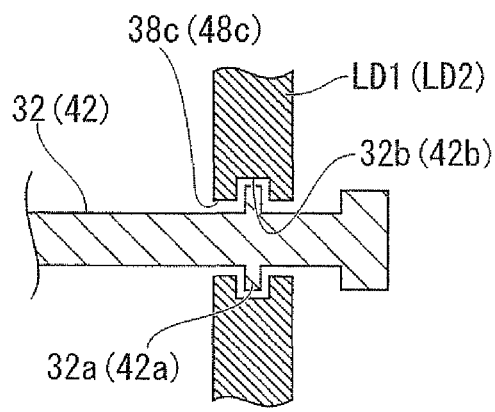
FIG. 22 is a diagram illustrating another configuration of a substrate processing unit.

As another modified example, as shown in, for example, FIG. 22, a protrusion portion 32a may be formed in a part of the holding portion 32 holding the substrate S and a groove portion 32b may be formed inside the opening 38c of the cover portion LD1. The protrusion portion 32a is formed, for example, in a flanged shape so that the diameter is increased around an outer surface of the holding portion 32. The groove portion 32b is formed around an inner surface of the opening OP1. The protrusion portion 32a is inserted into the groove portion 32b to form a margin between the protrusion portion 32a and the cover portion LD1.

By the configuration, since a space between the cover portion LD1 and the holding portion 32 can be smaller, the air tightness inside the cup portion CP can be enhanced. In FIG. 22, the cover portion LD1 of the loading-side carrying mechanism SC1 has been described, but the invention is not limited thereto. As denoted in brackets, the cover portion LD2 of the unloading-side carrying mechanism SC2 can be similarly described.

Figure 23:
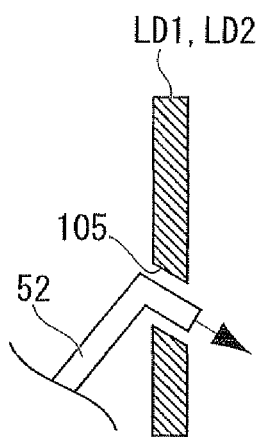
FIG. 23 is a diagram illustrating another configuration of a substrate processing unit.

Further, as another modified example, as shown in, for example, FIG. 23, a nozzle insertion hole 105 may be formed in the cover portion LD1 and LD2. For example, the nozzle 52 ejecting the liquid material to the substrate S and the like is inserted into the nozzle insertion hole 105. According to this configuration, while the cup portion CP is blocked by the cover portion LD1 and LD2, the nozzle 52 can be inserted into the cup portion CP. Accordingly, while the air tightness inside the cup portion CP is enhanced, the liquid material can be reliably applied to the substrate S.

Further, in the above-described embodiment, the second nozzle 56 is provided as the nozzle ejecting the cleaning liquid to clean the cup portion CP, but the invention is not limited thereto. For example, the nozzle 52 can also be used as the cleaning liquid nozzle. In this case, a switching mechanism (not shown) may be provided to switch the supply source of the nozzle 52 to the liquid material or the cleaning liquid. Accordingly, it is possible to efficiently perform the maintenance without complicating the configuration of the device.

Further, in the above-described embodiment, the position of the nozzle portion NZ is disposed at the −Z side of the rotation axis of the substrate S, and the liquid material is ejected along the direction of gravity. However, the invention is not limited thereto. For example, a configuration may be adopted in which the position of the nozzle portion NZ is disposed at the +Z side of the rotation axis of the substrate S, and the liquid material is ejected in the direction opposite to the direction of gravity.

Further, in the above-described embodiment, the nozzle 52 and the second nozzle 56 are formed to be bent, but the invention is not limited thereto. For example, the nozzle 52 and the second nozzle 56 may be formed to be curved toward the −Z side of the rotation axis of the substrate S. Accordingly, it is possible for the liquid material to smoothly circulate.

Further, in the above-described embodiment, a configuration has been described in which the nozzles 52 are disposed at the same position in the first surface and the second surface of the substrate S, but the invention is not limited thereto. For example, the nozzles 52 may be disposed at different positions in the first surface and the second surface. For example, the nozzle 52 may be disposed at the −Z side of the rotation axis of the substrate S at the +X side of the application position 50, and the nozzle 52 may be disposed at the +Z side of the rotation axis of the substrate S at the −X side of the application position 50. Of course, the arrangement at the +Z side and the −Z side may be reversed. The second nozzles 56 may have the same configuration.

Further, in the above-described embodiment, a configuration has been described in which the nozzle managing mechanism NM is disposed at the +Y side of each nozzle portion NZ, but the invention is not limited thereto. For example, the nozzle managing mechanism NM may be disposed at a different position if the nozzle portion NZ is within a movable range.

Further, in the above-described embodiment, a configuration has been described in which the substrate carrying mechanism SC is disposed at two positions inside the substrate processing unit SPU, but the invention is not limited thereto. For example, the substrate carrying mechanism SC may be disposed at one position or be disposed at three or more positions.

Further, in the above-described embodiment, a configuration has been described in which the substrate loading unit LDU includes a belt conveyor mechanism as the cassette moving mechanism 11, but the invention is not limited thereto. Instead of the belt conveyor mechanism, for example, a fork member holding the engagement portion Cx of the loading cassette C1 may be provided. For example, the fork member may have the same configuration as that of the cassette holding member 74 of the cassette carrying device CC. The engagement portion Cx of the loading cassette C1 held by the fork member may move inside the substrate loading unit LDU. The fork member may also be used as the cassette moving mechanism 61 of the substrate unloading unit ULU.

Further, in the above-described embodiment, a configuration has been described in which the cassette placing members 20a and 22a and the cassette carrying arms 20b and 22b are used as the mechanisms moving the loading cassette C1 and the unloading cassette C2 at the standby positions in the loading-side buffer mechanism BF1 and the unloading-side buffer mechanism BF2, but the invention is not limited thereto. For example, the conveyor belt may be provided in the loading-side buffer mechanism BF1.

In the same manner, even the buffer mechanism BF2 may be provided with a moving mechanism which sequentially moves the unloading cassette C2 in the order of: the standby position P5, the standby position P6, the standby position P8, the standby position P6, and the standby position P7. As the moving mechanism, for example, a fork member holding the engagement portions Cx of the loading cassette C1 and the unloading cassette C2 may be provided. The fork member may have the same configuration as that of the cassette holding member 74 of the cassette carrying device CC.

Further, in the above-described embodiment, a configuration has been described in which the substrate S is rotated by actively rotating both of the loading-side carrying mechanism SC1 and the unloading-side carrying mechanism SC2, but the invention is not limited thereto. For example, one of the loading-side carrying mechanism SC1 and the unloading-side carrying mechanism SC2 may be actively rotated, and the other thereof may passively rotate.

Further, in the above-described embodiment, a configuration has been described in which the loading-side carrying mechanism SC1 and the unloading-side carrying mechanism SC2 are disposed with the first surface Sa and the second surface Sb of the substrate S interposed therebetween and rotate the substrate S, but the invention is not limited thereto. For example, the loading-side carrying mechanism SC1 and the unloading-side carrying mechanism SC2 may solely hold and rotate the substrate S.

Further, in the above-described embodiment, a configuration has been described in which the peripheral edge portion removal mechanism EBR is disposed only at the unloading-side carrying mechanism SC2, but the invention is not limited thereto. For example, the peripheral edge portion removal mechanism EBR may also be disposed at the loading-side carrying mechanism SC1 (see the one-dotted chain line of FIG. 1). With such a configuration, it is possible to perform the application operation and the peripheral edge portion removal operation in both the loading-side carrying mechanism SC1 and the unloading-side carrying mechanism SC2.

For example, the peripheral edge portion removal operation may be performed by the unloading-side carrying mechanism SC2 while the application operation is performed by the loading-side carrying mechanism SC1. Conversely, the application operation may be performed by the unloading-side carrying mechanism SC2 while the peripheral edge portion removal operation is performed by the loading-side carrying mechanism SC1. In this manner, since it is possible to perform a parallel process by allowing two substrate carrying mechanisms SC to alternately access the application mechanism CT, it is possible to perform the process efficiently and to further shorten the process tact time.

Further, as described above, when the loading-side carrying mechanism SC1 and the unloading-side carrying mechanism SC2 simultaneously hold and rotate one substrate S, the peripheral edge portion removal mechanism EBR may be provided inside the application mechanism CT. With such a configuration, the loading-side carrying mechanism SC1 and the unloading-side carrying mechanism SC2 may perform the application operation while holding and rotating the substrate S, and may perform the peripheral edge portion removal operation subsequently after the application operation. Accordingly, since it is possible to perform the application operation and the peripheral edge portion removal operation in one device, it is possible to improve the efficiency of the process. Further, since the application operation and the peripheral edge portion removal operation are performed in one application mechanism CT, it is possible to load the next substrate S to be processed by the loading-side carrying mechanism SC1 while unloading one substrate S using the unloading-side carrying mechanism SC2 after the application operation and the peripheral edge portion removal operation for one substrate S are performed. Since it is possible to simultaneously perform the loading operation of the loading-side carrying mechanism SC1 and the unloading operation of the unloading-side carrying mechanism SC2, it is possible to improve the efficiency of the process.

In the above-described embodiment, both of the loading-side carrying mechanism SC1 and the unloading-side carrying mechanism SC2 are provided, but the invention is not limited thereto. Either the loading-side carrying mechanism SC1 or the unloading-side carrying mechanism SC2 may be disposed. In this case, a cover portion driving mechanism is solely disposed on one, in which a carrying mechanism SC is not provided, of the sides in which the cover portion driving mechanism 38 of the cover portion LD1 and the cover portion driving mechanism 48 of the cover portion LD2 are provided.

Further, in addition to the configuration of the above-described embodiment, for example, a dummy substrate holding mechanism or the like (not shown) may be provided. The dummy substrate holding mechanism holds a dummy substrate which is used to clean the cup portion CP. As the dummy substrate, for example, 2 or more substrates having different dimensions are used. For example, the dummy substrate holding mechanism holds the dummy substrate in an upright position. The dummy substrate may have the same dimensions as that of the substrate S or have dimensions different from those of the substrate S.

Figure 24:
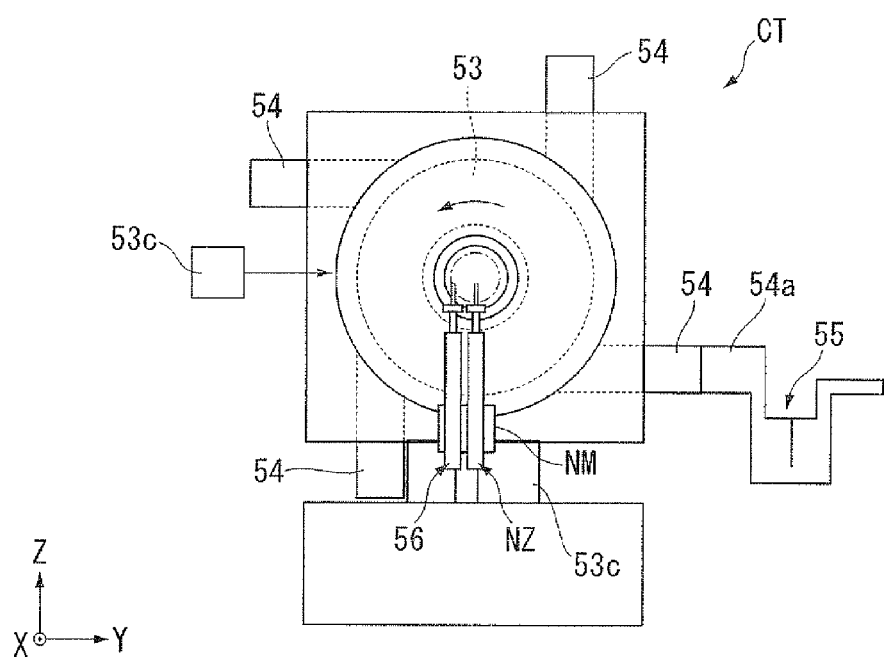
FIG. 24 is a side view illustrating another configuration of a substrate processing unit.

Further, in the above-described embodiment, the substrate processing unit SPU may rotate the inner cup CP1. As shown in FIG. 24, the substrate processing unit SPU is formed to rotate the inner cup CP1 in the direction along an outer periphery of the substrate S about the Z axis serving as a rotation axis. In addition, the substrate processing unit SPU includes a rotation mechanism 53c to rotationally drive the inner cup CP1. In this manner, since the inner cup CP1 is configured to rotate, the substrate processing unit SPU can rotate the inner cup CP1, in application of the liquid material to the substrate S, or the like.

Further, the substrate processing unit SPU can also rotate the inner cup CP1, in the same manner, when the inner cup CP1 is cleaned by the cleaning liquid while the substrate S rotates. By supplying the cleaning liquid while the inner cup CP1 rotates, a stream of the cleaning liquid may be formed inside the accommodation portion 53. Since it becomes possible to clean the inside of the accommodation portion 53 by the stream of the cleaning liquid, the cleaning efficiency can be enhanced.

In the configuration as shown in FIG. 24, the accommodation portion 53 and the discharge mechanism 54 of the inner cup CP1 are preferably configured to be connected. As per the accommodation portion 53 and the discharge mechanism 54 are connected, the liquid material and the cleaning liquid accommodated in the accommodation portion 53 are discharged through the discharge mechanism 54. Thus, it becomes possible to efficiently clean the inside of the accommodation portion 53.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A coating device comprising:
   a rotating part which rotatably holds a substrate while the substrate is upright;
   a cup portion disposed to surround an outer periphery of the substrate held by the rotating part and having an opening which exposes a first surface and a second surface of the substrate;
   a coating part which includes a nozzle ejecting a liquid material to the first surface and to the second surface of the substrate through the opening; and
   a cover portion which is provided to face the first and second faces of the substrate, wherein the cover portion is configured to open the opening so as to expose the first and second faces of the substrate, and to close the opening so as to cover the first and second faces of the substrate.

2. The coating device according to claim 1, wherein the cover portion is provided in the rotating part.

3. The coating device according to claim 1, wherein the opening is configured with dimensions through which the substrate is able to pass.

4. The coating device according to claim 1, wherein the rotating part comprises a rotation shaft holding the substrate and inserted into the cup portion, and the cover portion comprises a penetration hole penetrated by the rotation shaft.

5. The coating device according to claim 4, wherein the cover portion comprises a groove portion formed around the inner surface of the penetration hole, and the rotation shaft comprises a diameter increasing portion inserted into the groove portion.

6. The coating device according to claim 1, wherein the cover portion comprises a nozzle insertion hole.

7. The coating device according to claim 1, wherein the coating device further comprises a driving part moving the cover portion.

8. The coating device according to claim 1, wherein the cover portion is configured to be dividable.

9. The coating device according to claim 8, wherein the coating device further comprises a guide portion configured to move each part of the divided cover portion to a position where the opening is interposed between each part.

10. The coating device according to claim 1, wherein the cover portion is provided in the cup portion.

* * * * *

UNITED STATES PATENT AND TRADEMARK OFFICE
CERTIFICATE OF CORRECTION

PATENT NO. : 8,807,072 B2  
APPLICATION NO. : 13/251468  
DATED : August 19, 2014  
INVENTOR(S) : Futoshi Shimai et al.

Page 1 of 1

It is certified that error appears in the above-identified patent and that said Letters Patent is hereby corrected as shown below:

In the Specification,

In Column 5, Line 13 (Approx.), Change "form" to --from--.

In the Claims,

In Column 32, Line 22 (Approx.), In Claim 1, change "upright;" to --upright in the Z direction;--.

In Column 32, Line 25 (Approx.), In Claim 1, change "first surface" to --first face--.

In Column 32, line 25 (Approx.), In Claim 1, change "second surface" to --second face--.

In Column 32, Line 27, In Claim 1, change "a nozzle" to --nozzles simultaneously--.

In Column 32, Line 28 (Approx.), In Claim 1, change "first surface" to --first face--.

In Column 32, Line 28 (Approx.), In Claim 1, change "second surface" to --second face--.

Signed and Sealed this  
Fourteenth Day of April, 2015

Michelle K. Lee  
*Director of the United States Patent and Trademark Office*